United States Patent
Arakawa

(10) Patent No.: US 10,680,156 B2
(45) Date of Patent: Jun. 9, 2020

(54) PIEZOELECTRIC ACTUATOR, PIEZOELECTRIC MOTOR, ROBOT, ELECTRONIC COMPONENT CONVEYANCE APPARATUS, PRINTER, AND MANUFACTURING METHOD OF PIEZOELECTRIC ACTUATOR

(71) Applicant: Seiko Epson Corporation, Tokyo (JP)

(72) Inventor: Yutaka Arakawa, Hara-mura (JP)

(73) Assignee: Seiko Epson Corporation (JP)

( * ) Notice: Subject to any disclaimer, the term of this patent is extended or adjusted under 35 U.S.C. 154(b) by 313 days.

(21) Appl. No.: 15/707,087

(22) Filed: Sep. 18, 2017

(65) Prior Publication Data

US 2018/0090663 A1 Mar. 29, 2018

(30) Foreign Application Priority Data

Sep. 23, 2016 (JP) .................... 2016-185870

(51) Int. Cl.
| | |
|---|---|
| *H01L 41/04* | (2006.01) |
| *H02N 2/00* | (2006.01) |
| *H02N 2/02* | (2006.01) |
| *H02N 2/04* | (2006.01) |
| *H02N 2/10* | (2006.01) |
| *H01L 41/053* | (2006.01) |

(52) U.S. Cl.
CPC ........... *H01L 41/042* (2013.01); *H02N 2/002* (2013.01); *H02N 2/0025* (2013.01); *H02N 2/0055* (2013.01); *H02N 2/026* (2013.01); *H02N 2/04* (2013.01); *H02N 2/103* (2013.01); *H01L 41/053* (2013.01); *H02N 2/02* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0241488 | A1* | 10/2011 | Kimura | H02N 2/0015 310/323.16 |
| 2015/0114164 | A1* | 4/2015 | Urano | H02N 2/004 74/490.03 |
| 2015/0318801 | A1* | 11/2015 | Kamijo | H02N 2/0075 310/323.02 |
| 2016/0049573 | A1* | 2/2016 | Miyazawa | B25J 17/00 74/490.05 |
| 2016/0049574 | A1* | 2/2016 | Iwazaki | H02P 25/32 74/490.05 |

FOREIGN PATENT DOCUMENTS

| | | | |
|---|---|---|---|
| JP | 2015-186329 A | 10/2015 | |
| JP | 2016-040988 A | 3/2016 | |

* cited by examiner

*Primary Examiner* — Bryan P Gordon
(74) *Attorney, Agent, or Firm* — Harness, Dickey & Pierce, P.L.C.

(57) ABSTRACT

A piezoelectric actuator includes a vibrator having a vibrating part including a piezoelectric element and a transmitting portion provided in the vibrating part and transmitting drive power to a driven part, and an energizing part that may energize the vibrator toward the driven part, wherein the energizing part has a base portion connected to the vibrator and a pair of spring portions integrally formed with the base portion.

19 Claims, 17 Drawing Sheets

PIEZOELECTRIC ACTUATOR, PIEZOELECTRIC MOTOR, ROBOT, ELECTRONIC COMPONENT CONVEYANCE APPARATUS, PRINTER, AND MANUFACTURING METHOD OF PIEZOELECTRIC ACTUATOR

BACKGROUND

1. Technical Field

The present invention relates to a piezoelectric actuator, piezoelectric motor, robot, electronic component conveyance apparatus, printer, and manufacturing method of the piezoelectric actuator.

2. Related Art

In related art, as a piezoelectric actuator, e.g. a configuration described in Patent Document 1 (JP-A-2015-186329) is known. The piezoelectric actuator of Patent Document 1 includes a vibrator having a vibrating part and a transmitting portion provided in the vibrating part and transmitting drive power to a rotor (driven part), and an energizing part that energizes the vibrator toward the rotor. Further, the energizing part has a base portion fixed to the vibrator and a pair of spring portions connected to the base portion.

However, in the piezoelectric actuator of Patent Document 1, in the energizing part, the base portion and the pair of spring portions are separately formed and the pair of spring portions are fixed to the base portion by screws. When the base portion and the pair of spring portions are separately formed, downsizing is difficult.

SUMMARY

An advantage of some aspects of the invention is to provide a piezoelectric actuator that may be downsized, a piezoelectric motor, robot, electronic component conveyance apparatus, printer, and manufacturing method of the piezoelectric actuator.

The advantage can be achieved by the following configurations.

A piezoelectric actuator according to an aspect of the invention includes a vibrator having a vibrating part including a piezoelectric element and a transmitting portion provided in the vibrating part and transmitting drive power to a driven part, and an energizing part that may energize the vibrator toward the driven part, wherein the energizing part has a base portion connected to the vibrator and a pair of spring portions integrally formed with the base portion.

As described above, in the energizing part, the base portion and the pair of spring portions are integrally formed, and thereby, compared to the configuration in which the base portion and the pair of spring portions are separately formed and the portions are fixed using a fixing member such as screws as in related art, the piezoelectric actuator may be downsized.

In the piezoelectric actuator according to the aspect of the invention, it is preferable that the energizing part contains silicon.

With this configuration, for example, patterning by etching may be performed with higher accuracy, and the manufacture of the energizing part is easier.

In the piezoelectric actuator according to the aspect of the invention, it is preferable that the energizing part has an etching surface.

With this configuration, the energizing part may be formed with higher accuracy. Further, for example, connecting portions between the base portion and the spring portions are smoother and cracking starting from the portions is harder to occur.

In the piezoelectric actuator according to the aspect of the invention, it is preferable that the vibrator has a supporting part that connects to the base portion and supports the vibrating part.

With this configuration, the connection between the vibrator and the energizing part is easier.

In the piezoelectric actuator according to the aspect of the invention, it is preferable that the vibrator is provided between a plurality of the energizing parts.

With this configuration, the vibrator may be energized toward the driven part with balance.

In the piezoelectric actuator according to the aspect of the invention, it is preferable that the energizing part has a region overlapping with the vibrating part in a plan view as seen from a direction in which the vibrator and the energizing part overlaps, and an air gap is provided between the energizing part and the vibrating part in the overlapping region.

With this configuration, the contact between the energizing part and the vibrating part may be suppressed and the vibrating part may be efficiently vibrated.

In the piezoelectric actuator according to the aspect of the invention, it is preferable that the energizing part has a connecting portion connected to the base portion via the pair of spring portions, and the connecting portion is provided side by side with the base portion in a direction crossing an energization direction of the vibrator.

With this configuration, for example, in the connecting portion, the piezoelectric actuator may be fixed to another member. Further, the connecting portion is thus provided, and thereby, the piezoelectric actuator may be downsized more effectively.

In the piezoelectric actuator according to the aspect of the invention, it is preferable that a plurality of the vibrators are provided, wherein the plurality of vibrators are stacked.

With this configuration, the larger drive power may be generated.

A piezoelectric motor according to an aspect of the invention includes the piezoelectric actuator according to the aspect of the invention.

With this configuration, the piezoelectric motor with higher reliability that may enjoy the above-described piezoelectric actuator is obtained.

A robot according to an aspect of the invention includes the piezoelectric actuator according to the aspect of the invention.

With this configuration, the robot with higher reliability that may enjoy the above-described piezoelectric actuator is obtained.

An electronic component conveyance apparatus according to an aspect of the invention includes the piezoelectric actuator according to the aspect of the invention.

With this configuration, the electronic component conveyance apparatus with higher reliability that may enjoy the above-described piezoelectric actuator is obtained.

A printer according to an aspect of the invention includes the piezoelectric actuator according to the aspect of the invention.

With this configuration, the printer with higher reliability that may enjoy the above-described piezoelectric actuator is obtained.

A manufacturing method of a piezoelectric actuator according to an aspect of the invention includes preparing a vibrator plate having a plurality of vibrators including vibrating parts having piezoelectric elements, and an energizing part substrate having a plurality of energizing parts including base portions connected to the vibrators and pairs of spring portions; joining the vibrator plate and the energizing part substrate to obtain a piezoelectric actuator plate having a plurality of piezoelectric actuators; and singulating the plurality of piezoelectric actuators contained in the piezoelectric actuator plate.

With this configuration, the smaller piezoelectric actuator may be easily manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a piezoelectric actuator, piezoelectric motor, robot, electronic component conveyance apparatus, printer, and manufacturing method of the piezoelectric actuator of the invention will be explained in detail based on preferred embodiments shown in the accompanying drawings.

First Embodiment

First, a piezoelectric motor according to the first embodiment of the invention will be explained.

Figure 1:
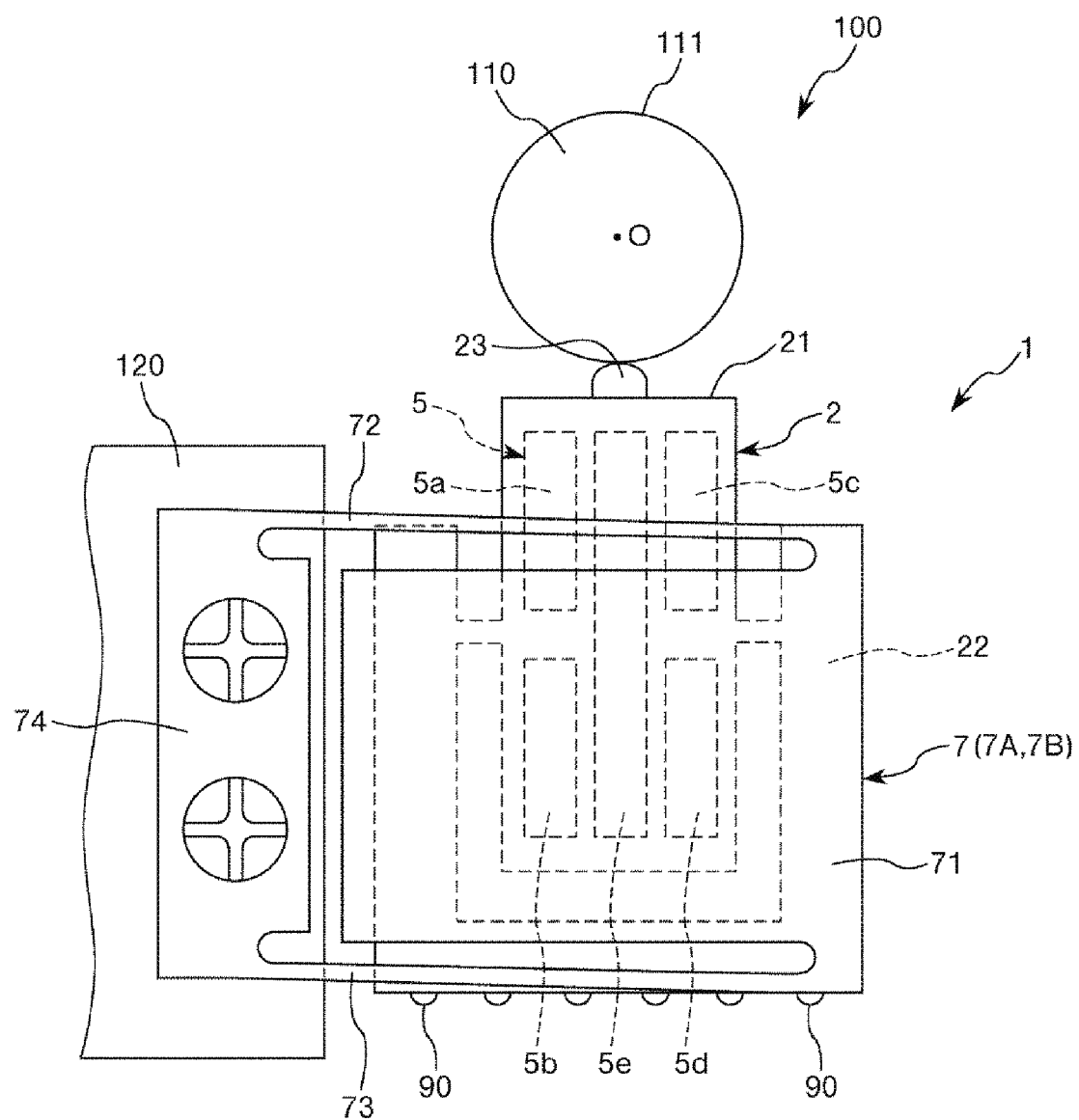
FIG. 1 is a plan view showing an overall configuration of a piezoelectric motor according to a first embodiment of the invention.
Figure 2:
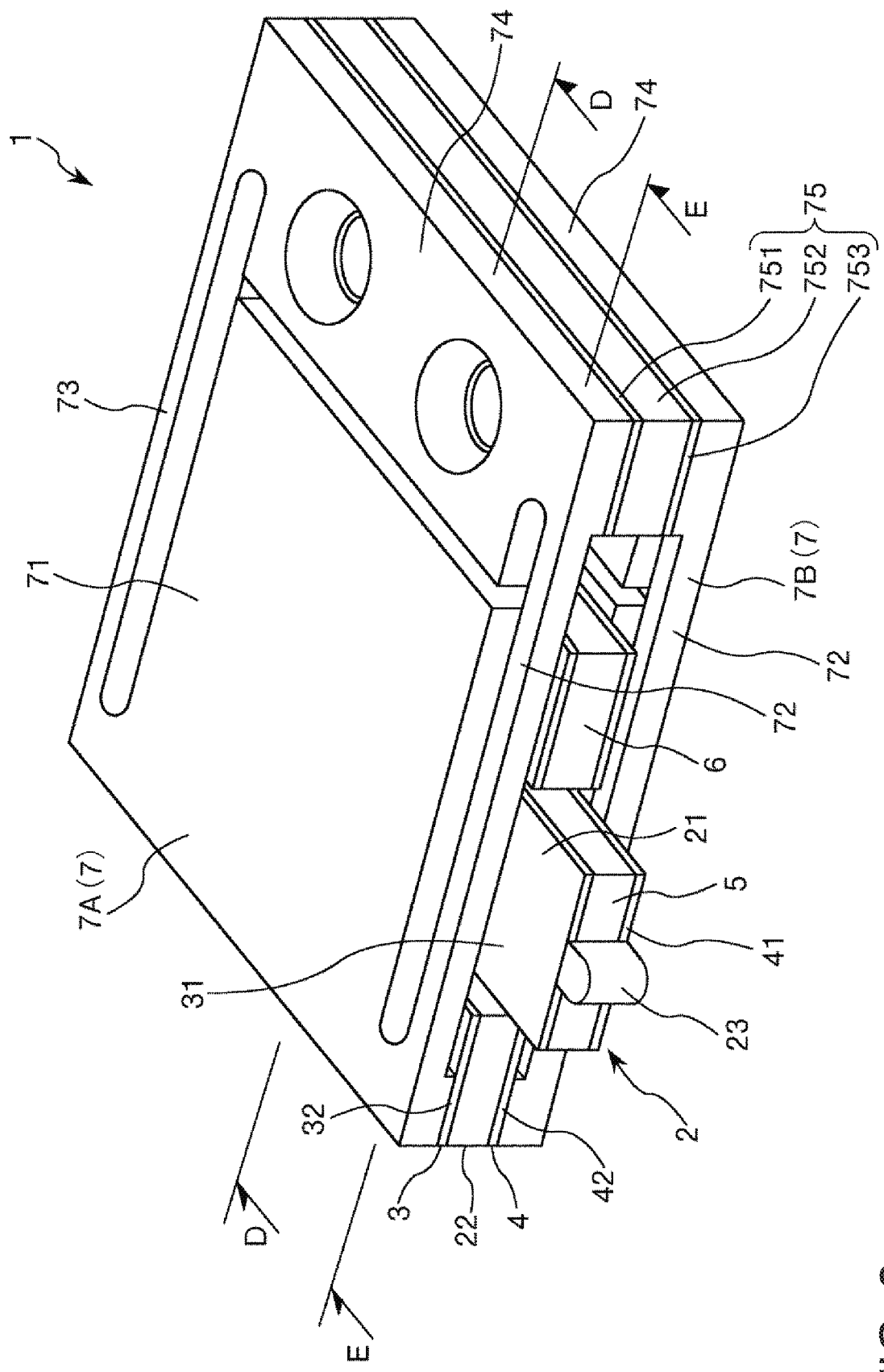
FIG. 2 is a perspective view showing a piezoelectric actuator of the piezoelectric motor shown in FIG. 1.
Figure 3:
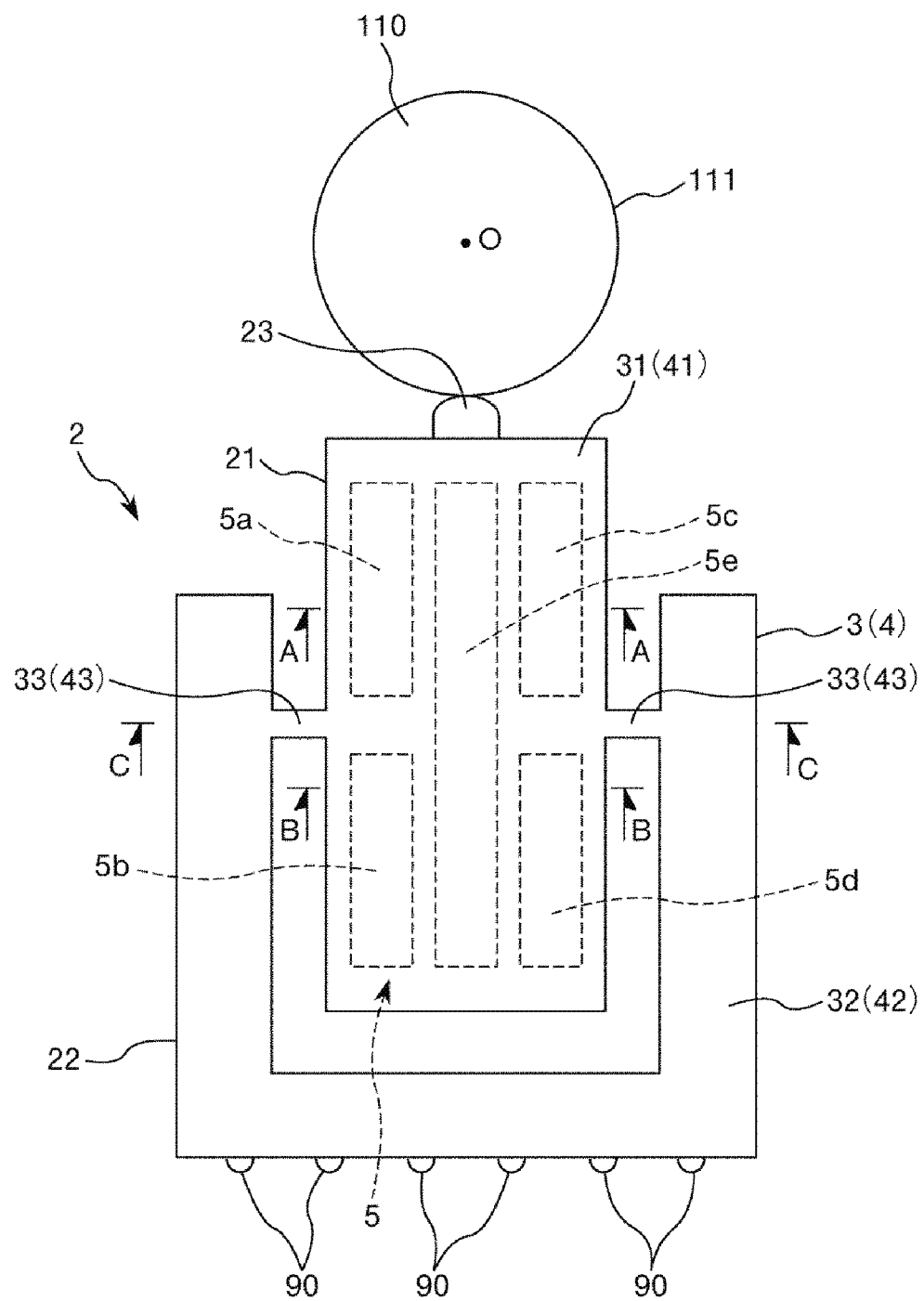
FIG. 3 is a plan view of the piezoelectric actuator shown in FIG. 2.
Figure 4:
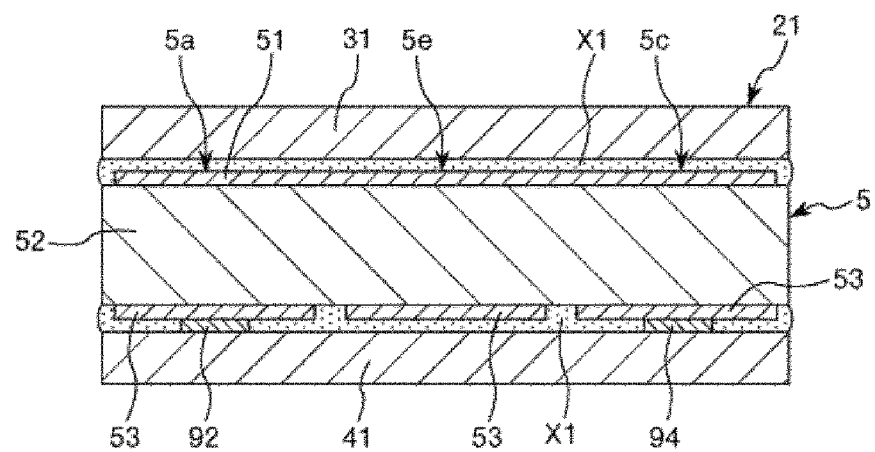
FIG. 4 is a sectional view along line A-A in FIG. 3.
Figure 5:
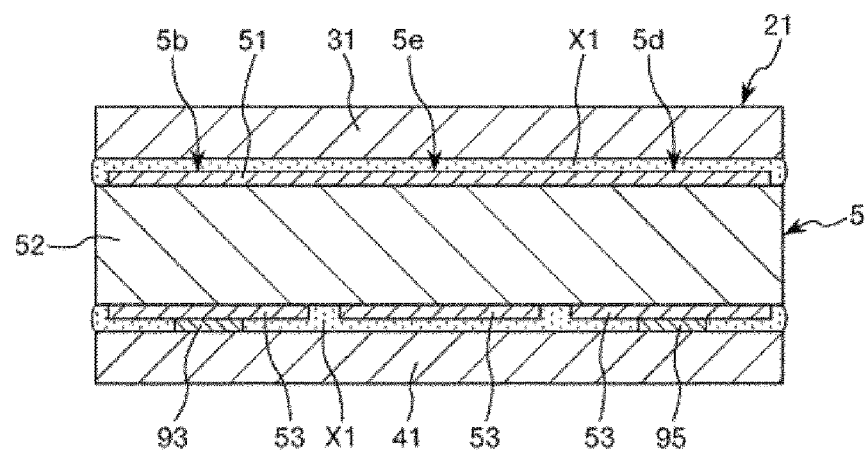
FIG. 5 is a sectional view along line B-B in FIG. 3.
Figure 6:
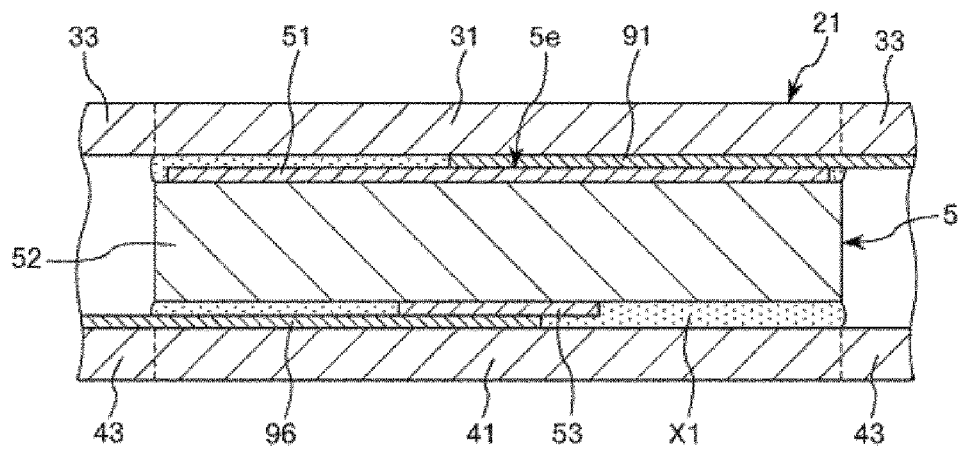
FIG. 6 is a sectional view along line C-C in FIG. 3.
Figure 7:
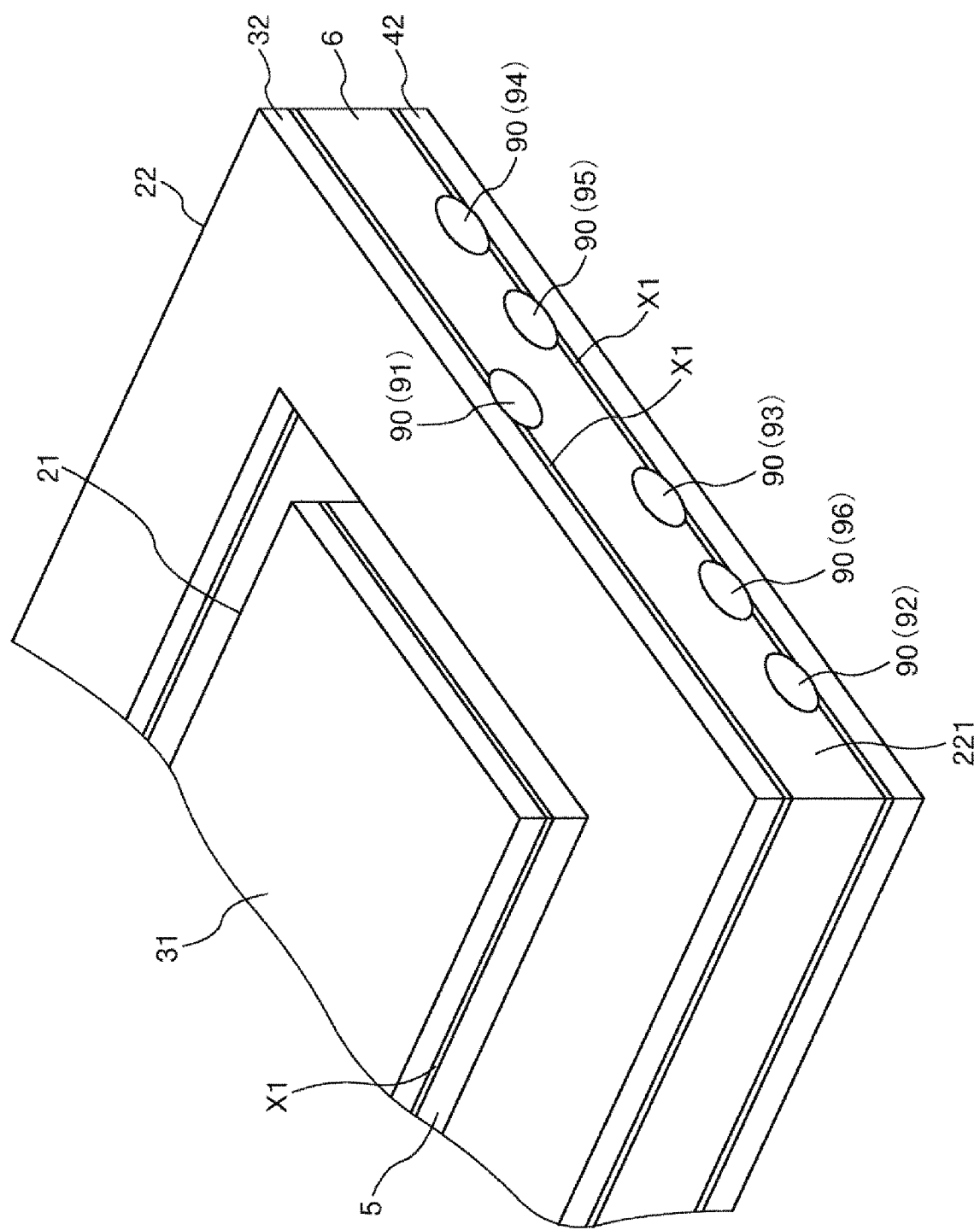
FIG. 7 is a perspective view showing a base end portion of the piezoelectric actuator shown in FIG. 2.
Figure 8:
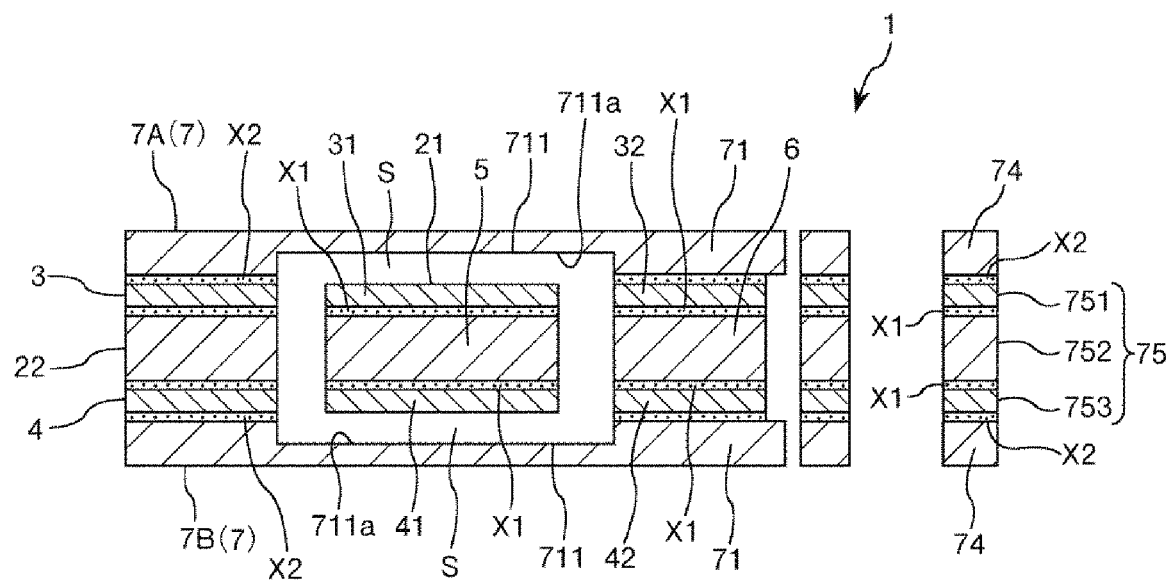
FIG. 8 is a sectional view along line D-D in FIG. 2.
Figure 9:
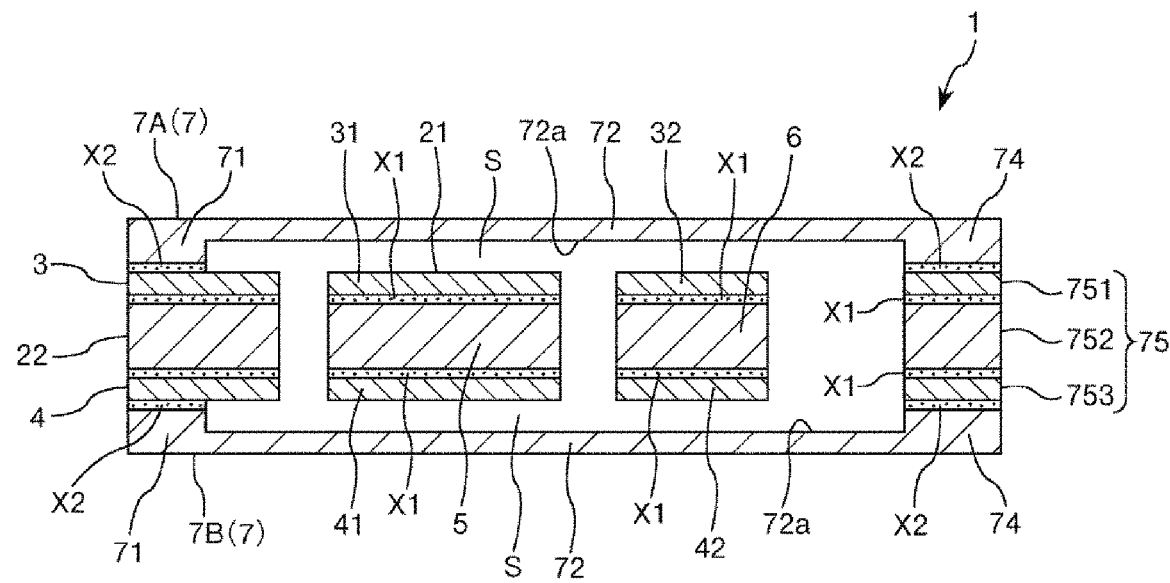
FIG. 9 is a sectional view along line E-E in FIG. 2.
Figure 10:
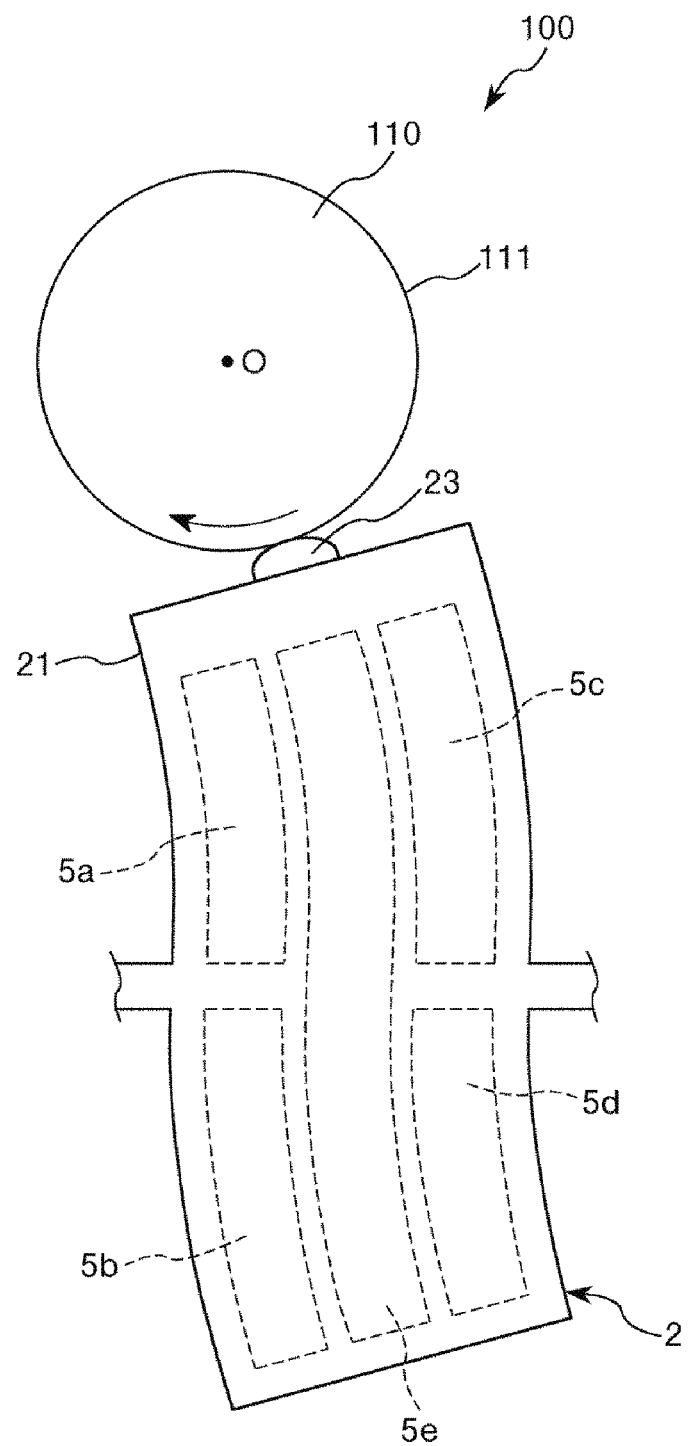
FIG. 10 is a schematic view for explanation of driving of the piezoelectric motor shown in FIG. 1.
Figure 11:
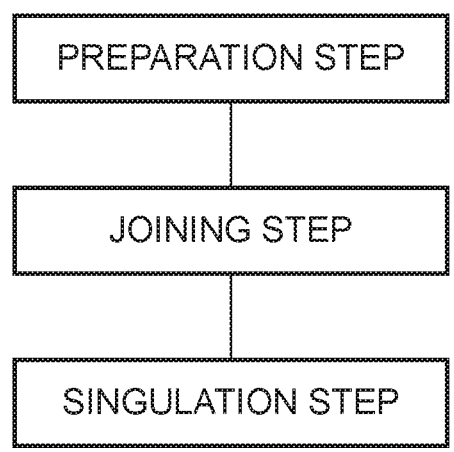
FIG. 11 is a flowchart showing a manufacturing method of the piezoelectric actuator shown in FIG. 2.

FIG. 1 is a plan view showing an overall configuration of the piezoelectric motor according to the first embodiment of the invention. FIG. 2 is a perspective view showing a piezoelectric actuator of the piezoelectric motor shown in FIG. 1. FIG. 3 is a plan view of the piezoelectric actuator shown in FIG. 2. FIG. 4 is a sectional view along line A-A in FIG. 3. FIG. 5 is a sectional view along line B-B in FIG. 3. FIG. 6 is a sectional view along line C-C in FIG. 3. FIG. 7 is a perspective view showing a base end portion of the piezoelectric actuator shown in FIG. 2. FIG. 8 is a sectional view along line D-D in FIG. 2. FIG. 9 is a sectional view along line E-E in FIG. 2. FIG. 10 is a schematic view for explanation of driving of the piezoelectric motor shown in FIG. 1. FIG. 11 is a flowchart showing a manufacturing method of the piezoelectric actuator shown in FIG. 2. FIGS. 12 to 16 are respectively side views (as seen from a tip end side) showing the manufacturing method of the piezoelectric actuator shown in FIG. 2. Note that, hereinafter, for convenience of explanation, the near side of the paper in FIG. 1 is also referred to as "upper" and the deep side of the paper in FIG. 1 is also referred to as "lower". Further, the rotor side of the piezoelectric actuator is also referred to as "tip end side" and the opposite side to the rotor is also referred to as "base end side".

A piezoelectric motor 100 (ultrasonic motor) shown in FIG. 1 includes a rotor 110 as a driven part (following part) rotatable about a rotation shaft O, and a piezoelectric actuator 1 in contact with an outer circumferential surface 111 of the rotor 110. In the piezoelectric motor 100, the piezoelectric actuator 1 is driven (vibrated), and thereby, the rotor 110 may be rotated about the rotation shaft O. Note that the configuration of the piezoelectric motor 100 is not limited to the configuration in FIG. 1. For example, in the embodiment, the rotor 110 that rotationally moves is used as the driven part, however, a member that linearly moves may be used as the driven part.

As shown in FIG. 1, the piezoelectric actuator 1 has a vibrator 2 including a vibrating part 21 having a piezoelectric element 5 and a transmitting portion 23 that transmits drive power to the rotor 110 as the driven part, and energizing parts 7 that may energize (having a function of energizing) the vibrator 2 toward the rotor 110. Further, the energizing part 7 includes a base portion 71 connected (fixed) to the vibrator 2 and a pair of spring portions 72, 73 integrally formed with the base portion 71. As described above, in the energizing part 7, the base portion 71 and the pair of spring portions 72, 73 are integrally formed, and thereby, compared to the configuration in which the base portion 71 and the pair of spring port ions 72, 73 are separately formed and the portions are fixed using a fixing member such as screws as in related art, the piezoelectric actuator 1 may be downsized and the structure may be simplified (reduction of the number of parts or the like). Further, for example, in the configuration of related art, energizing forces may vary among individuals and change with time due to fastening conditions of screws, loosening with time, or the like, however, according to the embodiment, such a problem does not occur and more stable energizing forces as designed may be obtained. As below, the piezoelectric actuator 1 will be explained in detail.

As shown in FIG. 2, the piezoelectric actuator 1 has the vibrator 2 and the energizing parts 7 that energize the vibrator 2 toward the rotor 110. Further, the vibrator 2 has a first substrate 3 and a second substrate 4 provided to face each other, and a piezoelectric element 5 and a first interlayer portion 6 located between these first, second substrates 3, 4 and joined via an adhesive.

Further, as shown in FIG. 3, the first substrate 3 has a vibrating plate 31, a supporting plate 32 that supports the vibrating plate 31, and a pair of connecting portions 33 that connect (couple) the vibrating plate 31 and the supporting plate 32. Similarly, the second substrate 4 has a vibrating plate 41, a supporting plate 42 that supports the vibrating plate 41, and a pair of connecting portions 43 that connect (couple) the vibrating plate 41 and the supporting plate 42. The first substrate 3 and the second substrate 4 have substantially the same shape and size, and the vibrating plates 31, 41 are provided to face each other via the piezoelectric element 5, the supporting plates 32, 42 are provided to face each other via the first interlayer portion 6, and the connecting portions 33, 43 are provided to face each other via an air gap. Further, in the vibrator 2, the vibrating plate 31, the piezoelectric element 5, and the vibrating plate 41 are stacked to form the vibrating part 21, and the supporting plate 32, the first interlayer portion 6, and the supporting plate 42 are stacked to form a supporting part 22. That is, the vibrator 2 has the vibrating part 21 and the supporting part 22 that supports the vibrating part 21.

The first substrate 3 and the second substrate 4 are not particularly limited, but e.g. silicon substrates may be used. The silicon substrates are used as the first substrate 3 and the second substrate 4, and thereby, the better processing accuracy (patterning accuracy) may be exerted. Further, a silicon wafer process (MEMS process) may be used for the manufacture of the vibrator 2 and the vibrator 2 may be efficiently manufactured. Note that insulating layers (not shown) are provided on the surfaces of the first substrate 3 and the second substrate 4. For example, when the silicon substrates are used as the first substrate 3 and the second substrate 4, the insulating layers may be formed using silicon oxide formed by thermal oxidation of the surfaces of the silicon substrates.

Next, the vibrating part 21 is explained. The vibrating part 21 has a nearly rectangular shape (longitudinal shape) in a plan view as seen from the thickness direction of the vibrator 2 (in a direction in which the vibrating plate 31, the piezoelectric element 5, and the vibrating plate 41 are stacked) (hereinafter, also simply referred to as "plan view"). Further, the transmitting portion 23 having a convex shape is provided in the tip end portion of the vibrating part 21 in the longitudinal direction at the center in the width direction. The transmitting portion 23 is a part that transmits the vibration of the vibrating part 21 to the rotor 110 and protrudes from the vibrating part 21 toward the tip end side and the tip end surface thereof is in contact with the outer circumferential surface 111 of the rotor 110. Accordingly, when the vibrating part 21 vibrates, the vibration is transmitted to the rotor 110 via the transmitting portion 23, and the rotor 110 rotates about the rotation shaft O.

Note that the shapes and placements of the vibrating part 21 and the transmitting portion 23 are not particularly limited as long as they may exert the functions thereof.

As shown in FIGS. 4 to 6, the piezoelectric element 5 is located between the vibrating plate 31 and the vibrating plate 41, joined to the vibrating plate 31 via an insulating adhesive X1 provided between the vibrating plate 31 and itself, and joined to the vibrating plate 41 via an insulating adhesive X1 provided between the vibrating plate 41 and itself. Note that the adhesive X1 is not particularly limited, but may be e.g. various thermosetting-resin adhesives including epoxy resin, urethane resin, urea resin, melamine resin, phenolic resin, and ester resin, and various thermoplastic-resin adhesives including vinyl acetate resin, polyvinyl alcohol resin, ethylene-vinyl acetate resin, vinyl chloride resin, acrylic resin, polyamide resin, cellulosic resin, polyvinylpyrrolidone resin, polystyrene resin, etc.

The piezoelectric element 5 includes five piezoelectric elements 5a, 5b, 5c, 5d, 5e. The piezoelectric element 5e is provided along the longitudinal direction of the vibrating part 21 in the center part in the width direction of the vibrating part 21. With respect to the piezoelectric element 5e, on one side in the width direction of the vibrating part 21, the piezoelectric elements 5a, 5b are provided along the longitudinal direction of the vibrating part 21 and, on the other side, the piezoelectric elements 5c, 5d are provided along the longitudinal direction of the vibrating part 21.

Further, the five piezoelectric elements 5a, 5b, 5c, 5d, 5e respectively have a piezoelectric material 52, a first electrode 51 provided on an upper surface (the principal surface on the vibrating plate 31 side) of the piezoelectric material 52, and second electrodes 53 provided on a lower surface (the principal surface on the vibrating plate 41 side) of the piezoelectric material 52.

The first electrode 51 is a common electrode provided in common with the piezoelectric elements 5a, 5b, 5c, 5d, 5e. On the other hand, the second electrodes 53 are individual electrodes individually provided with respect to each of the piezoelectric elements 5a, 5b, 5c, 5d, 5e. Further, the piezoelectric material 52 is integrally provided in common with the piezoelectric elements 5a, 5b, 5c, 5d, 5e. Note that the piezoelectric material 52 may be individually provided with respect to each of the piezoelectric elements 5a, 5b, 5c, 5d, 5e. Or, contrary to the embodiment, the first electrodes 51 may be individually provided with respect to each of the piezoelectric elements 5a, 5b, 5c, 5d, 5e and the second electrode 53 may be provided in common with the piezoelectric elements 5a, 5b, 5c, 5d, 5e.

The piezoelectric material 52 expands and contracts in directions along the longitudinal direction of the vibrating part 21 by application of an electric field in the directions along the thickness direction of the vibrating part 21. As the constituent material of the piezoelectric material 52, e.g. piezoelectric ceramics such as lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, or lead scandium niobate may be used. The piezoelectric material 52 of the piezoelectric ceramics may be formed from a bulk material or formed using a sol-gel method or sputtering, for example. It is preferable that the piezoelectric material is formed from a bulk material. Thereby, the manufacture of the vibrator 2 is easier. Note that, as the constituent material of the piezoelectric material 52, polyvinylidene fluoride, quartz crystal, or the like may be used in addition to the above-described piezoelectric ceramics.

In the embodiment, the piezoelectric material 52 is formed from a bulk material. In this case, the thickness of the piezoelectric material 52 is not particularly limited, but preferably from 100 μm to 600 μm, for example.

The constituent materials of the first electrode 51 and the second electrodes 53 are not particularly limited, but e.g. a metal material such as aluminum (Al), nickel (Ni), gold (Au), platinum (Pt), iridium (Ir), or copper (Cu) is used. The first electrode 52 and the second electrodes 53 may be respectively formed by evaporation, sputtering, or the like.

Next, the supporting part 22 is explained. The supporting part 22 has a U-shape surrounding the base end side of the vibrating part 21 in the plan view.

Further, as shown in FIG. 7, the first interlayer portion 6 is located between the supporting plate 32 and the supporting plate 42, joined to the supporting plate 32 via an insulating adhesive X1 provided between the supporting plate 32 and itself, and joined to the supporting plate 42 via an insulating adhesive X1 provided between the supporting plate 42 and itself. Further, the first interlayer portion 6 has substantially the same shape and size as the supporting plates 32, 42 in the plan view. Furthermore, the first interlayer portion 6 has an insulation property.

The first interlayer portion 6 is not particularly limited, but e.g. various ceramics such as zirconia, alumina, and titania, various metal materials, silicon, various resin materials, etc. may be used. Among them, various ceramics, various metal materials, silicon are preferably used, and thereby, the hard first interlayer portion 6 is obtained. Note that, when a metal material is used, in order to provide an insulation property to the first interlayer portion 6, it is necessary to perform processing including insulation treatment on the surface thereof or the like. Or, silicon is used, and thereby, the first interlayer portion 6 may be provided using a silicon wafer process and the vibrator 2 may be efficiently manufactured.

Note that the shape and placement of the supporting part 22 are not particularly limited as long as the part may exert the function thereof. For example, the supporting part 22 may be divided in two on one side (the side connected to one connecting portions 33, 43) and the other side (the side connected to the other connecting portions 33, 43) in the width direction of the vibrating part 21. Further, the first interlayer portion 6 of the embodiment has a single layer, however, the first interlayer portion 6 may have a configuration in which a plurality of layers are stacked. Furthermore, in the embodiment, the first interlayer portion 6 is formed by a single block, however, the first interlayer portion 6 may be divided in a plurality of blocks.

Here, it is preferable that the thickness of the first interlayer portion 6 is nearly equal to the thickness of the piezoelectric element 5. More specifically, it is preferable that the thickness of the first interlayer portion 6 is equal to or slightly smaller than the thickness of the piezoelectric element 5, and more preferable that the thickness of the first interlayer portion is slightly smaller than the thickness of the piezoelectric element. The relationship is satisfied, and thereby, the manufacture of the vibrator 2 is easier and the yield is improved. As will be described later in a manufacturing method, the vibrator 2 is manufactured by sandwiching of the adhesive X1, the piezoelectric element 5, and the first interlayer portion 6 between the first substrate 3 and the second substrate 4 and pressing and joining of them. Accordingly, the first interlayer portion 6 is made thinner than the piezoelectric element 5, and thereby, the first, second substrates 3, 4 and the piezoelectric element 5 are joined preferentially over the first, second substrates 3, 4 and the first interlayer portion 6, and the joining strength between the first, second substrates 3, 4 and the piezoelectric element 5 may be made sufficiently high and the first, second substrates 3, 4 and the piezoelectric element 5 may be bonded more reliably. As a result, the likeliness of defective driving and failure of the vibrating part 21 is lower.

As above, the vibrator 2 is explained. Note that a wire 91 electrically connected to the first electrode 51 of the piezoelectric element 5 is provided on the inner surface of the first substrate 3 (the surface on the piezoelectric element 5 side) (see FIG. 4), and wires 92, 93, 94, 95, 96 electrically connected to the respective second electrodes 53 of the piezoelectric element 5 are provided on the inner surface of the second substrate 4 (the surface on the piezoelectric element 5 side) (see FIGS. 4 to 6). Further, as shown in FIG. 7, these wires 91, 92, 93, 94, 95, 96 are exposed as terminal portions 90 on a side surface 221 of the supporting part 22 on the base end side. Accordingly, the piezoelectric element is externally electrically connected via the terminal portions 90.

Next, the energizing parts 7 are explained. The energizing parts 7 have the function of energizing the above-described vibrator 2 toward the rotor 110. As shown in FIG. 2, a pair of the energizing parts 7 are provided with the vibrator 2 in between. That is, the vibrator 2 is provided between the two (plurality of) energizing parts 7. Specifically, the energizing parts 7 include an energizing part 7A located on one side in the thickness direction of the vibrator 2 and an energizing part 7B located on the other side and are provided to sandwich the vibrator 2. As described above, the pair of energizing parts 7 are provided with the vibrator 2 in between, and thereby, the vibrator 2 may be energized toward the rotor 110 with balance, specifically, with the suppressed inclination in the thickness direction. Note that it is necessary that at least one energizing part 7 is provided and one of the energizing parts 7A, 7B may be omitted.

As shown in FIG. 2, the energizing parts 7 (7A, 7B) have plate-like shapes and each has the base portion 71, the pair of spring portions 72, 73 connected (coupled) to the base portion 71, and a connecting portion 74 connected (coupled) to the base portion 71 via the pair of spring portions 72, 73. Further, as shown in FIG. 8, the base portions 71 and the supporting part 22 of the vibrator 2 are connected (joined). The base portions 71 and the supporting part 22 are connected, and thereby, connection (joint) between the vibrator 2 and the energizing parts 7 is easier. The joining method between the base portions 71 and the supporting part 22 is not particularly limited, but the base portions 71 and the supporting part 22 may be directly joined using activation bonding or the like or the base portions 71 and the supporting part 22 may be joined using adhesives. Note that, in the embodiment, the base portions 71 and the supporting part 22 are joined using insulating adhesives X2. The insulating adhesive X2 is not particularly limited, but e.g. the same adhesive as the above-described adhesive X1 may be used.

Further, at least parts of the energizing parts 7A, 7B have regions overlapping with the vibrating part 21 in a plan view (in a plan view as seen from a direction in which the vibrating part 21 and the energizing parts 7A, 7B overlap), and air gaps S are provided between the energizing parts 7 and the vibrating part 21 in the overlapping regions. More specifically, as in FIG. 8, the base portion 71 has a region overlapping with the vibrating part 21 in the plan view, and a concave portion 711 opening in the inner surface (the surface on the vibrator 2 side) is formed in the region. Thereby, the air gap S is formed between the base portion 71 and the vibrating part 21. Further, as shown in FIG. 9, the spring portion 72 has a region overlapping with the vibrating part 21 in the plan view. The spring portion 72 is formed to be thinner than the part of the base portion 71 joined to the supporting part 22 (in other words, the part without the concave portion 771), and is provided to be unevenly distributed toward the outer surface (opposite surface to the vibrator 2) side of the energizing part 7. Thereby, the air gap S is formed between the spring portion 72 and the vibrating part 21. As described above, the air gaps S are formed between the energizing parts 7A, 7B and the vibrating part 21, and thereby, contact between the energizing parts 7A, 7B and the vibrating part 21 may be suppressed and the vibrating part 21 may be vibrated efficiently in a desired trajectory.

Note that, in the embodiment, a bottom surface 711a of the concave portion 711 and an inner surface 72a of the spring portion 72 (the principal surface on the vibrator 2 side) are located on the same plane. The bottom surface 711a of the concave portion 711 and the inner surface 72a of the spring portion 72 are located on the same plane, and thereby, the concave portion 711 and the spring portion 72 may be formed at a time by the same etching process. Accordingly, the manufacturing process of the energizing parts 7A, 7B is shorter.

The spring portions 72, 73 extend in directions crossing the energization directions of the vibrator 2 (upward and downward directions in FIG. 1: the longitudinal directions of the vibrating part 21), particularly, in the embodiment, in directions orthogonal to the energization directions (lateral directions in FIG. 1: width directions of the vibrating part 21). Further, as shown in FIG. 1, the piezoelectric actuator 1 is fixed to a stage 120 with the spring portions 72, 73 elastically deformed, and thereby, the energization force in the upward direction in FIG. 1 is generated with respect to the vibrator 2 and the transmitting portion 23 of the vibrator 2 is pressed against the outer circumferential surface 111 of the rotor 110. The spring portions 72, 73 are provided side by side along the energization directions, the spring portion 72 is connected to the tip end part of the base portion 71, and the spring portion 73 is connected to the base end part of the base portion 71. The spring portions 72, 73 is thus arranged, and thereby, the vibrator 2 may be energized toward the rotor 110 more stably.

The connecting portion 74 is connected to the base portion 71 via the spring portions 72, 73. The connecting portion 74 also functions as a fixing portion for fixing the piezoelectric actuator 1 to the stage 120 and, in the embodiment, the piezoelectric actuator 1 is fixed to the stage 120 by screws. Note that the fixing method of the piezoelectric actuator 1 to the stage 120 is not particularly limited.

As shown in FIG. 1, the connecting portion 74 is provided side by side with the base portion 71 in the directions crossing the energization directions of the vibrator 2 (upward and downward directions in FIG. 1), particularly, in the embodiment, in directions orthogonal to the energization directions (lateral directions in FIG. 1: width directions of the vibrating part 21). Thereby, the length of the piezoelectric actuator 1 (the length in the energization directions) is suppressed and the piezoelectric actuator 1 may be downsized. Further, the base portion 71 and the connecting portion 74 are arranged side by side in the width directions of the vibrating part 21, and thereby, the spring portions 72, 73 coupling those portions may be formed in linear shapes extending in the width directions of the vibrating part 21. Accordingly, the spring portions 72, 73 that may efficiently generate the energization force may be provided in the smaller space and that contributes to downsizing of the piezoelectric actuator 1. Further, the sufficient space may be secured around the side surface 221 of the supporting part 22 on the base end side by the arrangement, and external electrical connection of the terminal portions 90 may be easily made.

Note that the thickness of the connecting portion 74 is nearly equal to the thickness of the base portion 71 (the thickness of the part without the concave portion 711).

The constituent material of the energizing parts 7A, 7B is not particularly limited, but preferably contains silicon. Accordingly, e.g. silicon substrates may be used as the energizing parts 7A, 7B. The silicon substrates are used as the energizing parts 7A, 7B, and thereby, the better processing accuracy (patterning accuracy) may be exerted. Further, a silicon wafer process (MEMS process) may be used for the manufacture of the piezoelectric actuator 1 and the piezoelectric actuator 1 may be efficiently manufactured.

The energizing parts 7A, 7B are formed by patterning of the silicon substrates using etching. Accordingly, the energizing parts 7A, 7B have etching surfaces. Specifically, the side surfaces of the energizing parts 7A, 7B are the etching surfaces. The energizing parts 7A, 7B are formed by etching of the silicon substrates, and thereby, the energizing parts 7A, 7B (specifically, the side surfaces facing the base portions 71 of the spring portions 72, 73) may be formed with higher dimensional accuracy. Accordingly, for example, the widths and lengths of the spring portions 72, 73 may be easily formed as designed and the energization force as designed is obtained. Particularly, the base portions 71 and the spring portions 72, 73 are integrally formed, and thereby, the effect of patterning by etching may be exerted more strongly.

Particularly, silicon deep etching (so-called "Bosch process") is used as etching, and thereby, higher aspect ratios may be accommodated and, even when the thicknesses of the energizing parts 7A, 7B are large, and the gaps between the base portions 71 and the spring portions 72, 73 are smaller, the energizing parts 7A, 7B may be formed with higher accuracy. When patterning is performed by etching, particularly, the connecting portions between the base portions 71 and the spring portions 72, 73 and the connecting portions between the spring portions 72, 73 and the connecting portions 74 are smoother and cracking starting from the portions is harder to occur. Accordingly, the piezoelectric actuator 1 with higher mechanical strength is obtained. Note that the forming method of the energizing parts 7A, 7B is not limited to etching, but may be e.g. punching or the like.

Here, as shown in FIGS. 8 and 9, a second interlayer portion 75 is provided between the connecting portion 74 of the energizing part 7A and the connecting portion 74 of the energizing part 7B. The second interlayer portion 75 is a member for filling the gap between the connecting portion 74 of the energizing part 7A and the connecting portion 74 of the energizing part 7B and connecting the connecting portion 74 of the energizing part 7A and the connecting portion 74 of the energizing part 7B. Thereby, the mechanical strength of the connecting port ions 74 is higher and the piezoelectric actuator 1 may be fixed to the stage 120 more strongly.

The second interlayer portion 75 is joined to the connecting portion 74 via the insulating adhesive X2 provided between one connecting portion 74 and itself and joined to the connecting portion 74 via the insulating adhesive X2 provided between the other connecting portion 74 and itself.

Further, the second interlayer portion 75 has substantially the same shape and size as the connecting portion 74 in the plan view.

The thickness of the second interlayer portion 75 is nearly equal to the thickness of the vibrator 2. Thereby, deflections of the energizing parts 7A, 7B in the thickness directions may be suppressed and the vibrator 2 may be energized in a desired direction more reliably.

The second interlayer portion 75 is formed as a stacked structure in which a first layer 751, a second layer 752, and a third layer 753 are sequentially stacked from the energizing part 7A side via the adhesives X1. Further, the first layer 751 is formed from the same substrate as the first substrate 3, the second layer 752 is formed from the same substrate as the first interlayer portion 6, and the third layer 753 is formed from the same substrate as the second substrate 4. That is, the second interlayer portion 75 has the same configuration as the supporting part 22 of the vibrator 2. The second interlayer portion 75 has the above-described configuration, and thereby, for example, the second interlayer portion 75 having the nearly equal thickness to that of the vibrator 2 may be easily formed by the manufacturing method note to be described later.

Note that, as described above, the first layer 751 is formed from the same substrate as the first substrate 3, the second layer 752 is formed from the same substrate as the first interlayer portion 6, and the third layer 753 is formed from the same substrate as the second substrate 4, and thereby, the constituent material of the first layer 751, the second layer 752, and the third layer 753 is the same as the constituent material of the first substrate 3, the first interlayer portion 6, and the second substrate 4.

As above, the configuration of the piezoelectric motor 100 is explained. Next, an example of operation of the piezoelectric motor 100 is explained. Note that the operation method of the piezoelectric motor 100 is not limited to the following method. When drive signals at predetermined frequencies (alternating voltages) are applied to the respective piezoelectric elements 5a, 5b, 5c, 5d, 5e so that the phase difference between the piezoelectric elements 5a, 5d and the piezoelectric elements 5b, 5c may be 180° and the phase difference between the piezoelectric elements 5a, 5d and the piezoelectric element 5e may be 30°, as shown in FIG. 10, the piezoelectric elements 5a, 5b, 5c, 5d, 5e respectively expand and contract and the vibrating part 21 flexurally deforms in an S-shape (expansively and contractively deforms in the longitudinal directions and flexurally deforms in the width directions), and thereby, the tip end of the transmitting portion 23 makes an elliptic motion. As a result, the rotor 110 rotates in an arrow direction about the rotation shaft O. In this regard, the drive signal is applied to the piezoelectric element 5e so that the phase difference from the piezoelectric elements 5a, 5d may be 210°, and thereby, the rotor 110 may be reversely rotated.

As above, the piezoelectric actuator 1 and the piezoelectric motor 100 including the piezoelectric actuator are explained in detail. The piezoelectric motor 100 includes the piezoelectric actuator 1. Accordingly, the piezoelectric motor may enjoy the above-described advantages of the piezoelectric actuator 1 and may exert better reliability.

Next, a manufacturing method of the piezoelectric actuator 1 will be explained. As shown in FIG. 11, the manufacturing method of the piezoelectric actuator 1 includes a preparation step of preparing a vibrator plate 20 having a plurality of vibrators 2 including the vibrating parts 21 having the piezoelectric elements 5, and an energizing part substrate 70 having a plurality of energizing parts 7 including the base portions 71 connected (fixed) to the vibrators 2 and the pairs of spring portions 72, 73 integrally formed with the base portion 71, a joining step of joining the vibrator plate and the energizing part substrate 70 to obtain a piezoelectric actuator plate 10 having a plurality of piezoelectric actuators 1, and a singulation step of singulating the plurality of piezoelectric actuators 1 contained in the piezoelectric actuator plate 10. As below, the manufacturing method will be specifically explained.

Preparation Step

Figure 12:
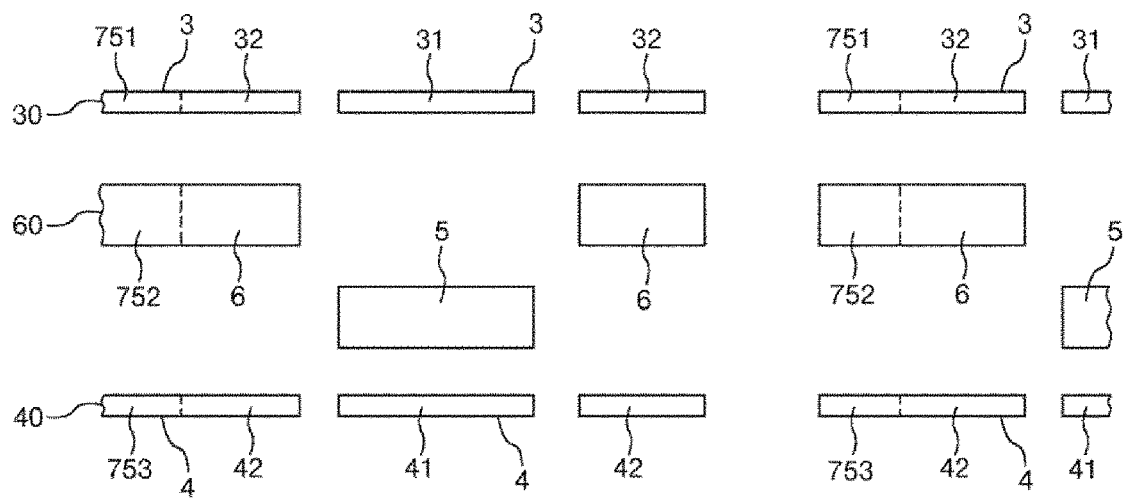
FIG. 12 is a side view (as seen from a tip end side) showing the manufacturing method of the piezoelectric actuator shown in FIG. 2.
Figure 13:
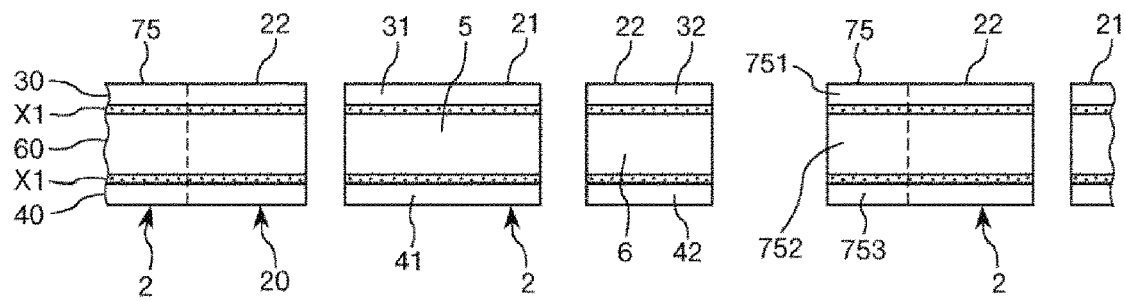
FIG. 13 is a side view (as seen from the tip end side) showing the manufacturing method of the piezoelectric actuator shown in FIG. 2.

First, as shown in FIG. 12, a first silicon substrate 30 in which a plurality of first substrates 3 contained in the vibrators 2 and a plurality of first layers 751 contained in the second interlayer portions 75 are provided side by side, a second silicon substrate 40 in which a plurality of second substrates 4 contained in the vibrators 2 and a plurality of third layers 753 contained in the second interlayer portions 75 are provided side by side, a third silicon substrate 60 in which a plurality of first interlayer portions 6 contained in the vibrators 2 and a plurality of second layers 752 contained in the second interlayer portions 75 are provided side by side, and the piezoelectric elements 5 are prepared. Then, as shown in FIG. 13, with the third silicon substrate 60 and the piezoelectric elements 5 sandwiched by the first silicon substrate 30 and the second silicon substrate 40, they are joined via adhesives X1. Thereby, the vibrator plate 20 in which the plurality of vibrators 2 are arranged side by side is obtained. Note that the first silicon substrate 30, the second silicon substrate 40, and the third silicon substrate 60 are respectively formed by patterning using etching (particularly, silicon deep etching) of silicon substrates. Thereby, the first silicon substrate 30, the second silicon substrate 40, and the third silicon substrate 60 having the better processing accuracy are obtained.

Figure 14:
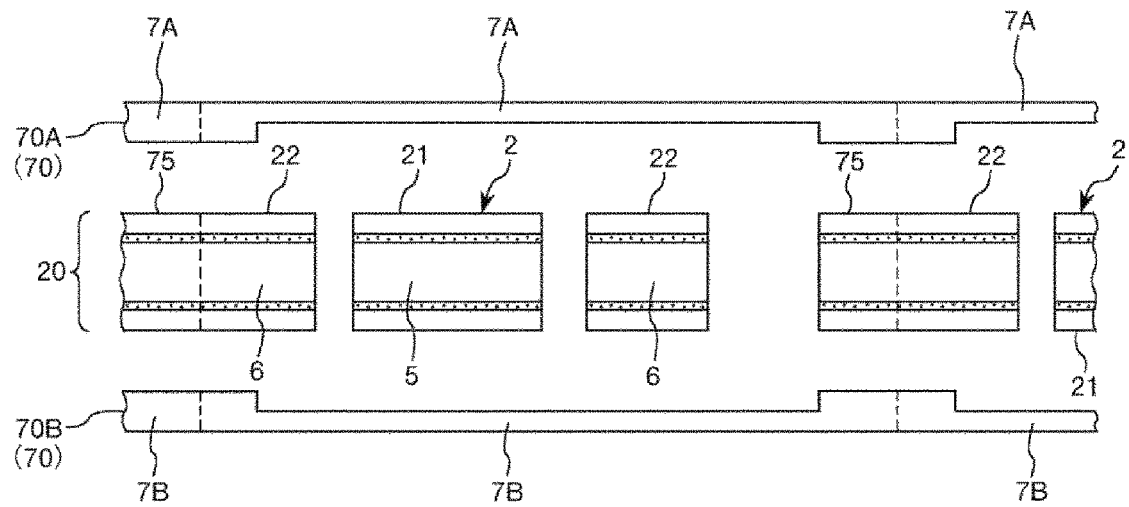
FIG. 14 is a side view (as seen from a tip end side) showing the manufacturing method of the piezoelectric actuator shown in FIG. 2.

Further, separately from the vibrator plate 20, as shown in FIG. 14, an energizing part substrate 70A in which a plurality of energizing parts 7A are provided side by side, and an energizing part substrate 70B in which a plurality of energizing parts 7B are provided side by side are prepared. Note that the energizing part substrates 70A, 70B are respectively formed by patterning using etching (particularly, silicon deep etching) of silicon substrates. Thereby, the energizing part substrates 70A, 70B having the better processing accuracy are obtained.

Joining Step

Figure 15:
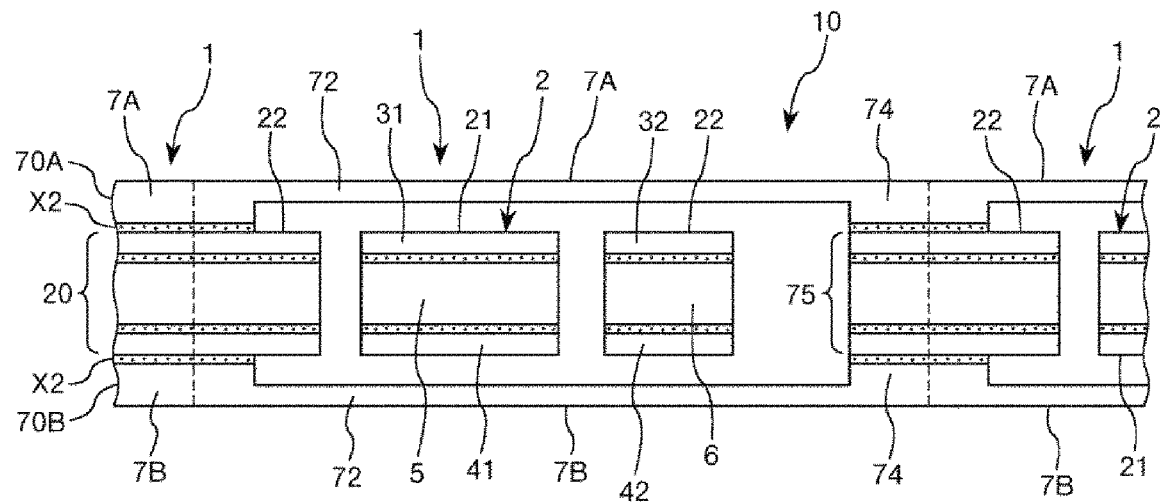
FIG. 15 is a side view (as seen from the tip end side) showing the manufacturing method of the piezoelectric actuator shown in FIG. 2.

Then, as shown in FIG. 15, with the vibrator plate 20 sandwiched by the two energizing part substrates 70A, 70B, they are joined via adhesives X2. Thereby, the piezoelectric actuator plate 10 in which the plurality of piezoelectric actuators 1 are provided side by side (the piezoelectric actuators 1 without the transmitting portions 23) is obtained.

Singulation Step

Figure 16:
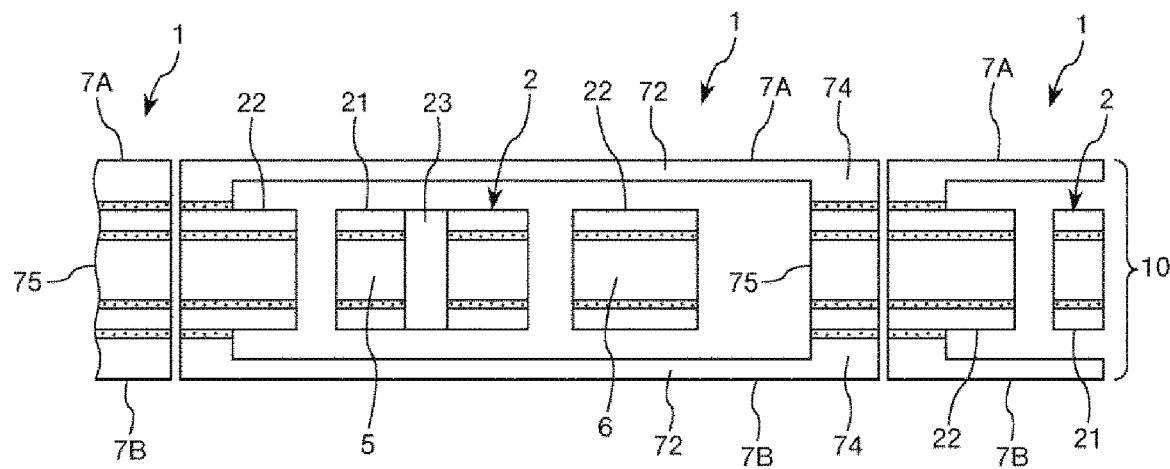
FIG. 16 is a side view (as seen from the tip end side) showing the manufacturing method of the piezoelectric actuator shown in FIG. 2.

Then, the transmitting portions 23 are joined to the respective vibrating parts 21 via e.g. adhesives. Then, as shown in FIG. 16, unnecessary portions are cut off using a dicing blade or the like, and thereby, the plurality of piezoelectric actuators 1 contained in the piezoelectric actuator plate 10 are singulated. Thereby, the plurality of piezoelectric actuators 1 are obtained.

According to the manufacturing method of the piezoelectric actuator 1, the smaller piezoelectric actuator may be easily manufactured. Note that, in the embodiment, the transmitting portions 23 are joined to the respective vibrating parts 21 prior to the singulation step, however, the time when the transmitting portions 23 are joined is not particularly limited, but may be after the singulation step, for example.

Second Embodiment

Next, a piezoelectric actuator according to the second embodiment of the invention will be explained.

Figure 17:
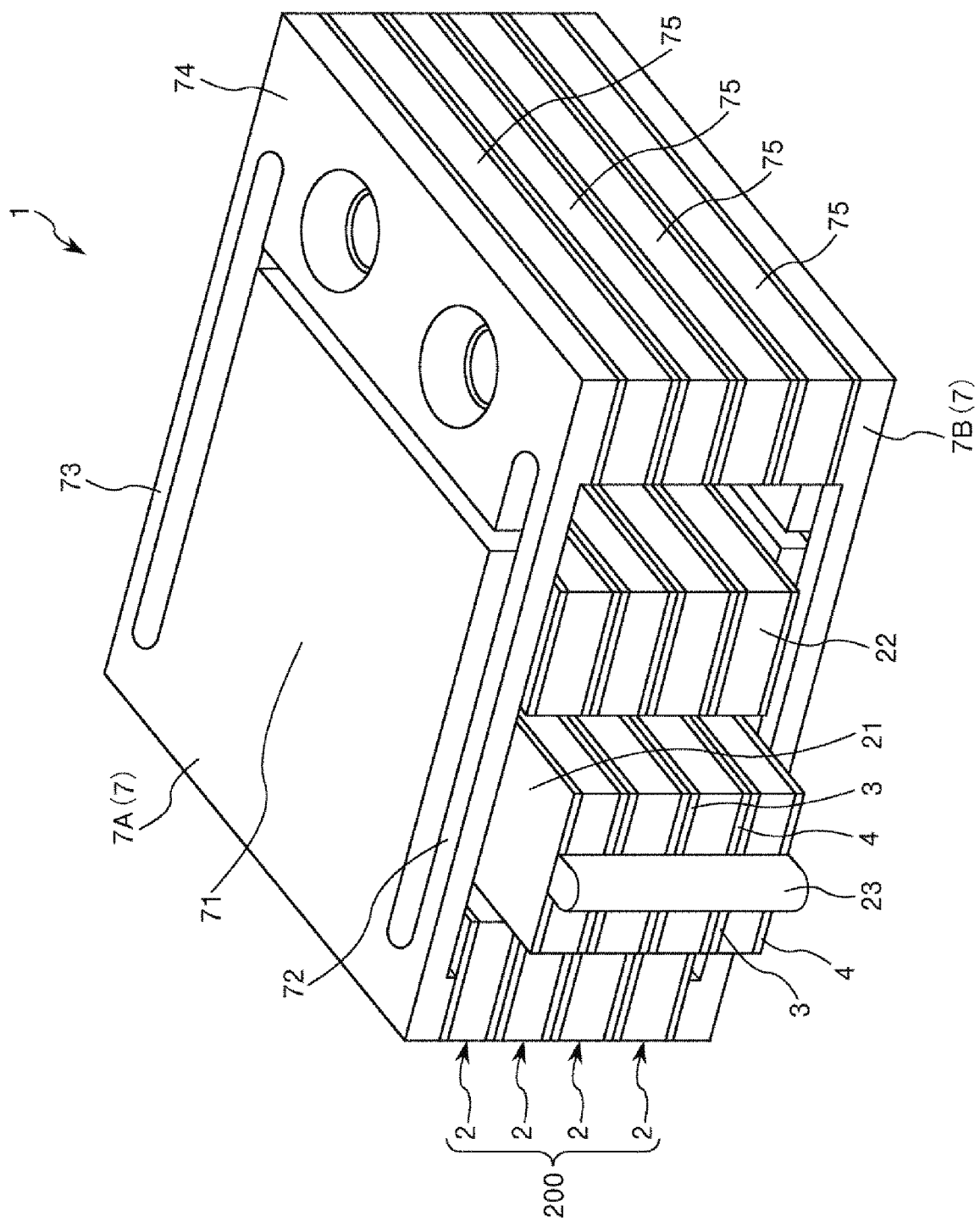
FIG. 17 is a perspective view showing a piezoelectric actuator according to a second embodiment of the invention.

FIG. 17 is a perspective view showing the piezoelectric actuator according to the second embodiment of the invention.

The embodiment is the same as the above-described first embodiment except that a plurality of vibrators are stacked.

Note that, in the following explanation, the embodiment will be explained with a focus on the differences from the above-described embodiment and the explanation of the same items will be omitted. Further, in FIG. 17, the same configurations as those of the above-described embodiment have the same signs.

As shown in FIG. 17, the piezoelectric actuator 1 of the embodiment has a plurality of vibrators 2, and the plurality of vibrators 2 are stacked in the thickness direction of the piezoelectric actuator 1. Further, the respective vibrators 2 are stacked in the same orientation with the first substrates 3 on the upside and the second substrates 4 on the downside. Furthermore, the two overlapping vibrators 2 are joined by e.g. adhesives (not shown). The energizing parts 7A, 7B are provided to sandwich a stacked structure 200 in which the plurality of vibrators 2 overlap. In correspondence therewith, the second interlayer portions 75 in the equal number to the number of vibrators 2 are stacked between the connecting portion 74 of the energizing part 7A and the connecting portion of the energizing part 7B. According to the configuration, for example, compared to the above-described first embodiment, the drive power of the piezoelectric actuator 1 may be made higher.

Note that the number of stacked vibrators 2 is not particularly limited, but may be appropriately set depending on the placement space of the piezoelectric actuator 1, the drive power required for the piezoelectric actuator 1, or the like. Further, in the embodiment, in the two overlapping vibrators 2, the first substrate 3 of one vibrator 2 and the second substrate 4 of the other vibrator 2 are provided to overlap, however, for example, the first substrate 3 of one vibrator 2 and the second substrate 4 of the other vibrator 2 may be formed by a single substrate. That is, the first substrate 3 of one vibrator 2 may also serve as the second substrate 4 of the other vibrator 2.

According to the second embodiment, the same advantages as those of the above-described first embodiment may be exerted.

Third Embodiment

Next, a piezoelectric actuator according to the third embodiment of the invention will be explained.

Figure 18:
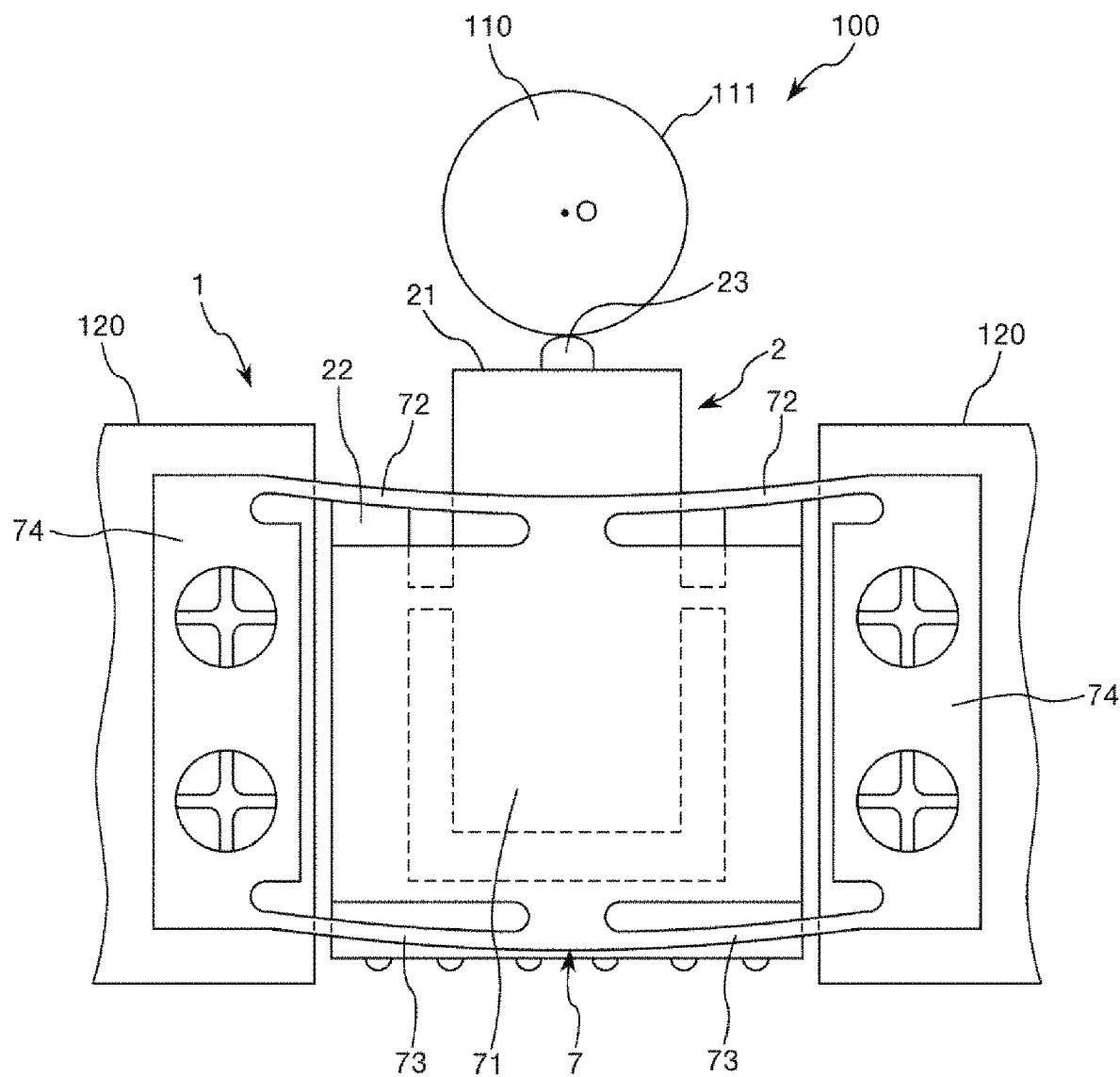
FIG. 18 is a plan view showing a piezoelectric actuator according to a third embodiment of the invention.

FIG. 18 is a plan view showing the piezoelectric actuator according to the third embodiment of the invention.

The embodiment is the same as the above-described first embodiment except that the configuration of the energizing part is different.

Note that, in the following explanation, the embodiment will be explained with a focus on the differences from the above-described embodiments and the explanation of the same items will be omitted. Further, in FIG. 18, the same configurations as those of the above-described embodiments have the same signs.

As shown in FIG. 18, in the energizing part 7 of the piezoelectric actuator 1 of the embodiment, a pair of connecting portions 74 are provided with the base portion 71 in between in the width direction of the vibrating part 21. Further, pairs of spring portions 72, 73 are provided to respectively connect the base portion 71 and the respective connecting portions 74.

According to the third embodiment, the same advantages as those of the above-described first embodiment may be exerted.

Fourth Embodiment

Next, a piezoelectric actuator according to the fourth embodiment of the invention will be explained.

Figure 19:
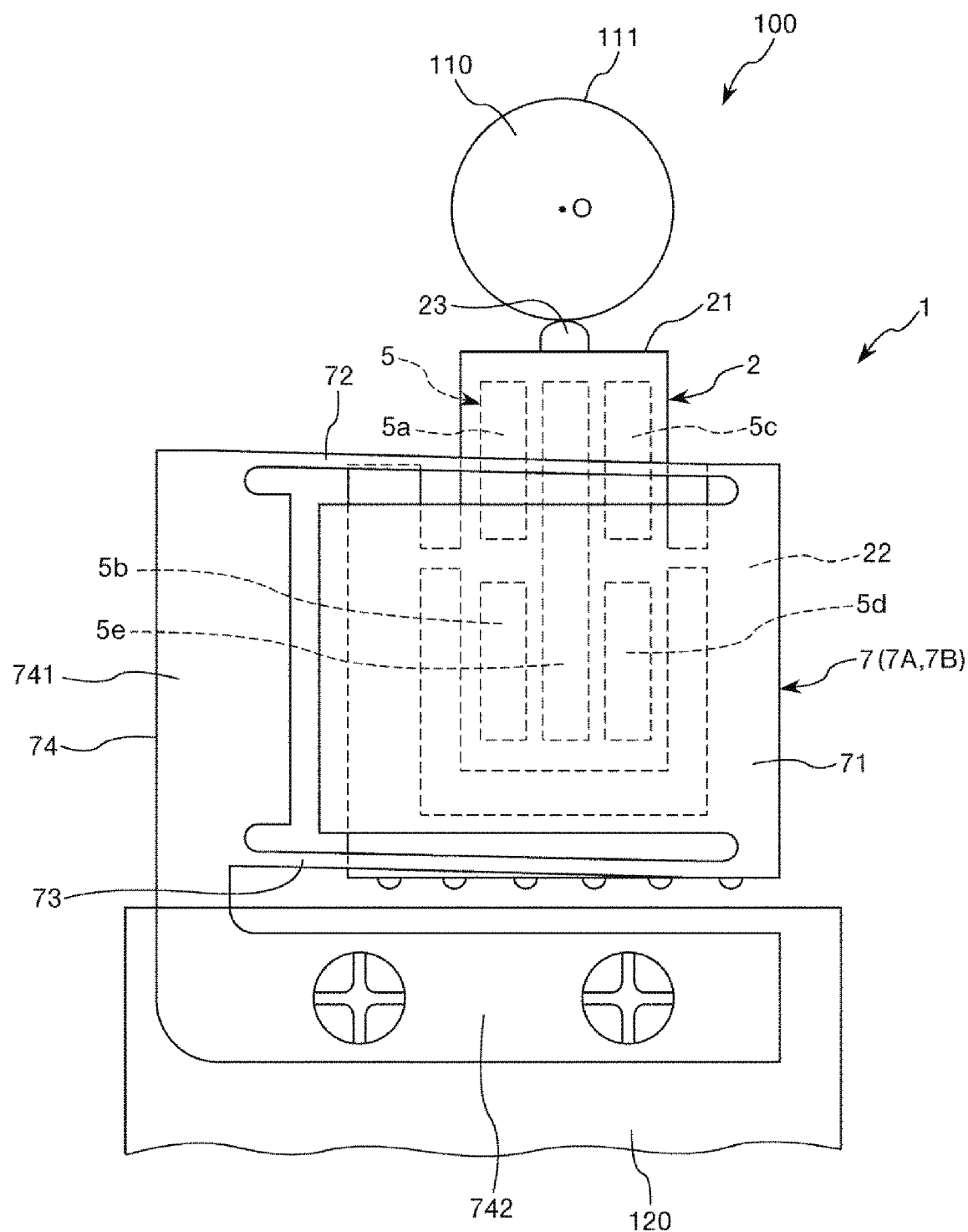
FIG. 19 is a plan view showing a piezoelectric actuator according to a fourth embodiment of the invention.

FIG. 19 is a plan view showing the piezoelectric actuator according to the fourth embodiment of the invention.

The embodiment is the same as the above-described first embodiment except that the configuration of the energizing part is different.

Note that, in the following explanation, the embodiment will be explained with a focus on the differences from the above-described embodiments and the explanation of the same items will be omitted. Further, in FIG. 19, the same configurations as those of the above-described embodiments have the same signs.

As shown in FIG. 19, in the energizing part 7 of the piezoelectric actuator 1 of the embodiment, the connecting portion 74 has an L-shape and fastened to the stage 120 with screws on the base end side of the vibrator 2. The connecting portion 74 has a main body part 741 located on the side of the vibrator 2 and connected to the pair of spring portions 72, 73 and an extension part 742 extending from the main body part 741 and located on the base end side of the vibrator 2, and fastened to the stage 120 with screws in the extension part 742.

According to the fourth embodiment, the same advantages as those of the above-described first embodiment may be exerted.

Fifth Embodiment

Next, a robot according to the fifth embodiment of the invention will be explained.

Figure 20:
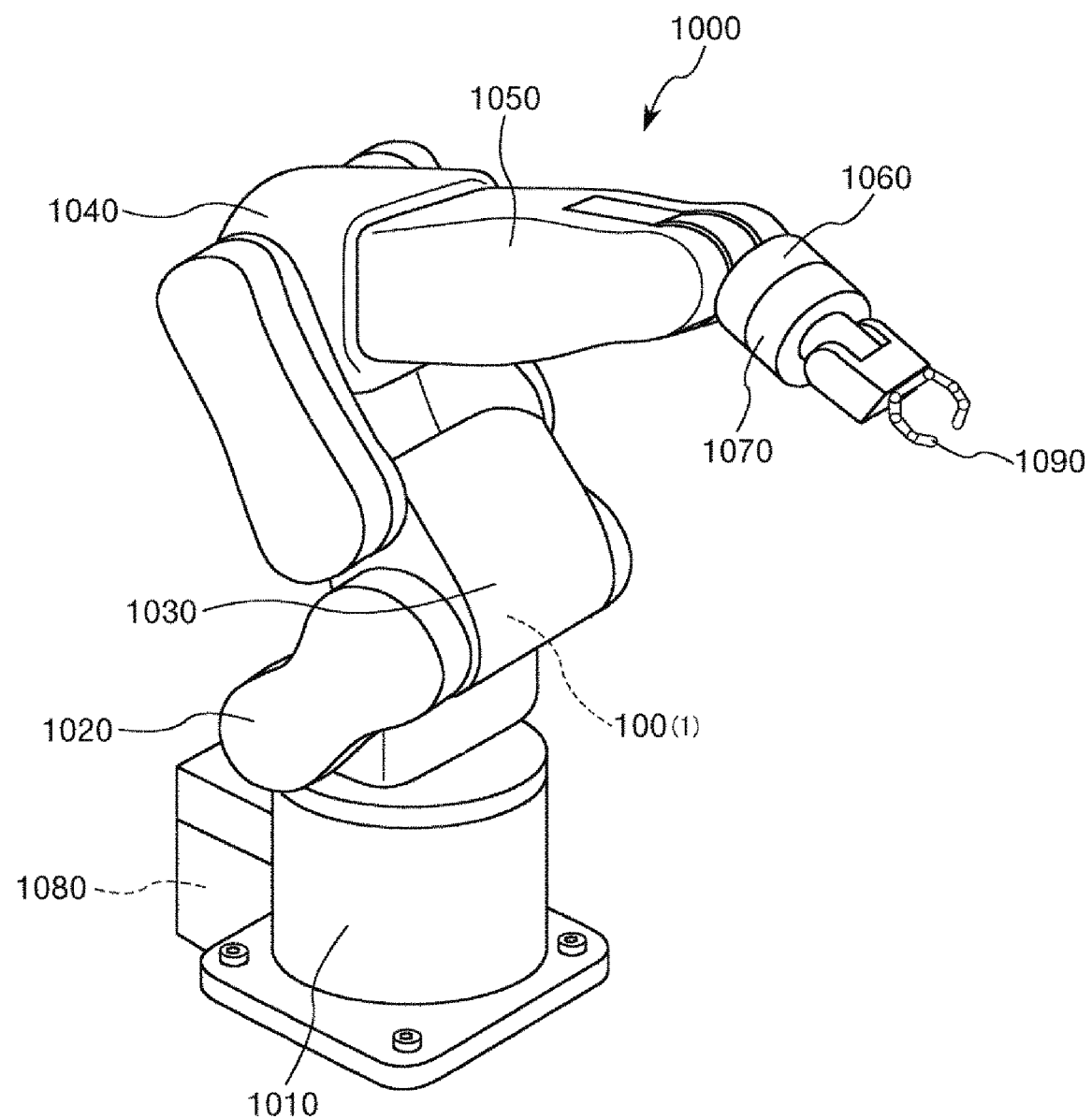
FIG. 20 is a perspective view showing a robot according to a fifth embodiment of the invention.

FIG. 20 is a perspective view showing the robot according to the fifth embodiment of the invention.

A robot 1000 shown in FIG. 20 may perform work of feeding, removing, carrying, assembly, etc. of precision apparatuses and components forming the apparatuses (objects). The robot 1000 is a six-axis robot, and has a base 1010 fixed to a floor or ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a robot control unit 1080 that controls driving of these arms 1020, 1030, 1040, 1050, 1060, 1070. Further, a hand connecting part is provided in the arm 1070, and an end effector 1090 according to work to be executed by the robot 1000 is attached to the hand connecting part. Piezoelectric motors 100 (piezoelectric actuators 1) are mounted on all or part of the respective joint parts, and the respective arms 1020, 1030, 1040, 1050, 1060, 1070 rotate by driving of the piezoelectric motors 100. Note that the driving of the respective piezoelectric motors 100 is controlled by the robot control unit 1080.

The robot 1000 includes the piezoelectric motors 100 (piezoelectric actuators 1), and thereby, may enjoy the above-described advantages of the piezoelectric actuators 1 and may exert good reliability.

Sixth Embodiment

Next, an electronic component conveyance apparatus according to the sixth embodiment of the invention will be explained.

Figure 21:
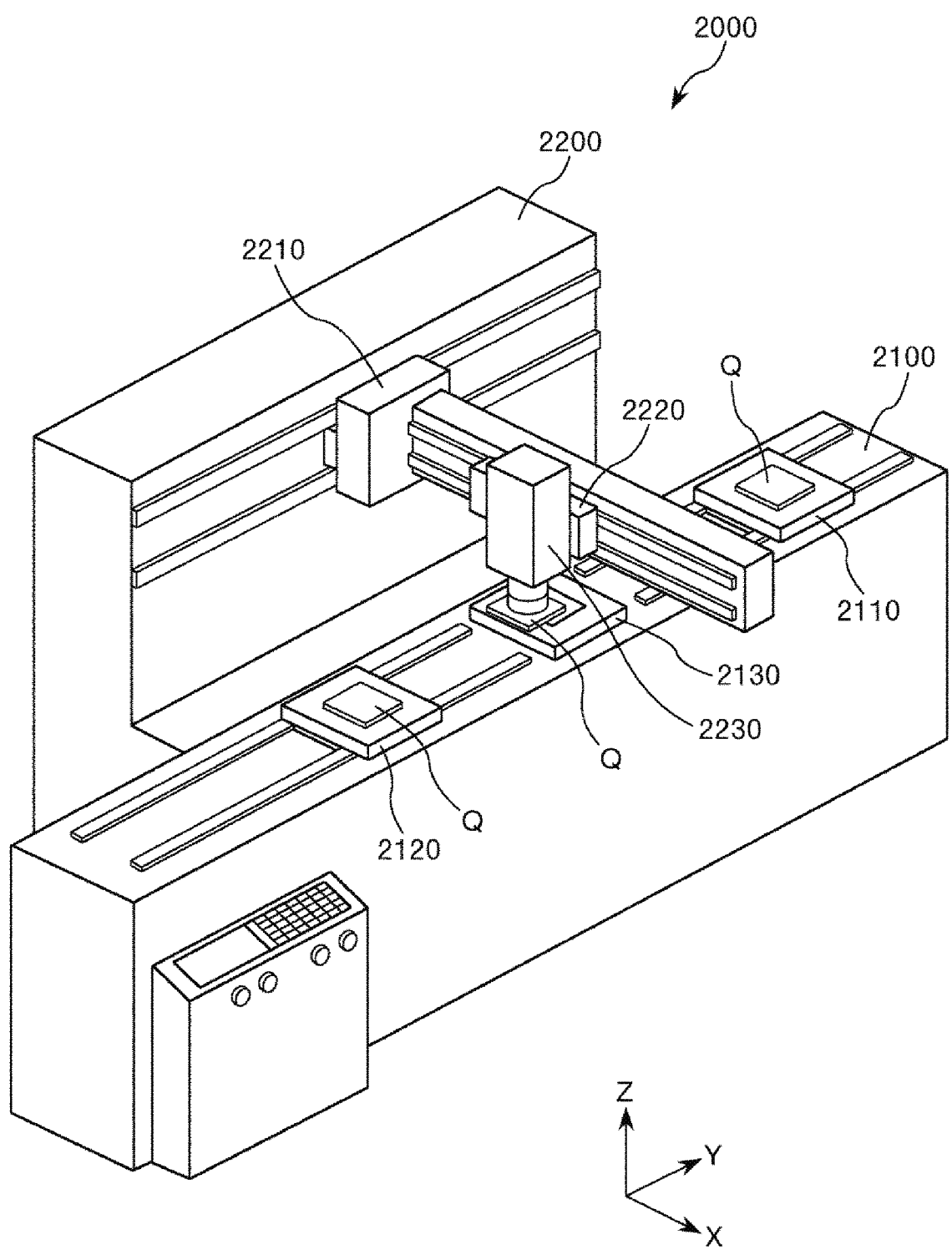
FIG. 21 is a perspective view showing an electronic component conveyance apparatus according to a sixth embodiment of the invention.
Figure 22:
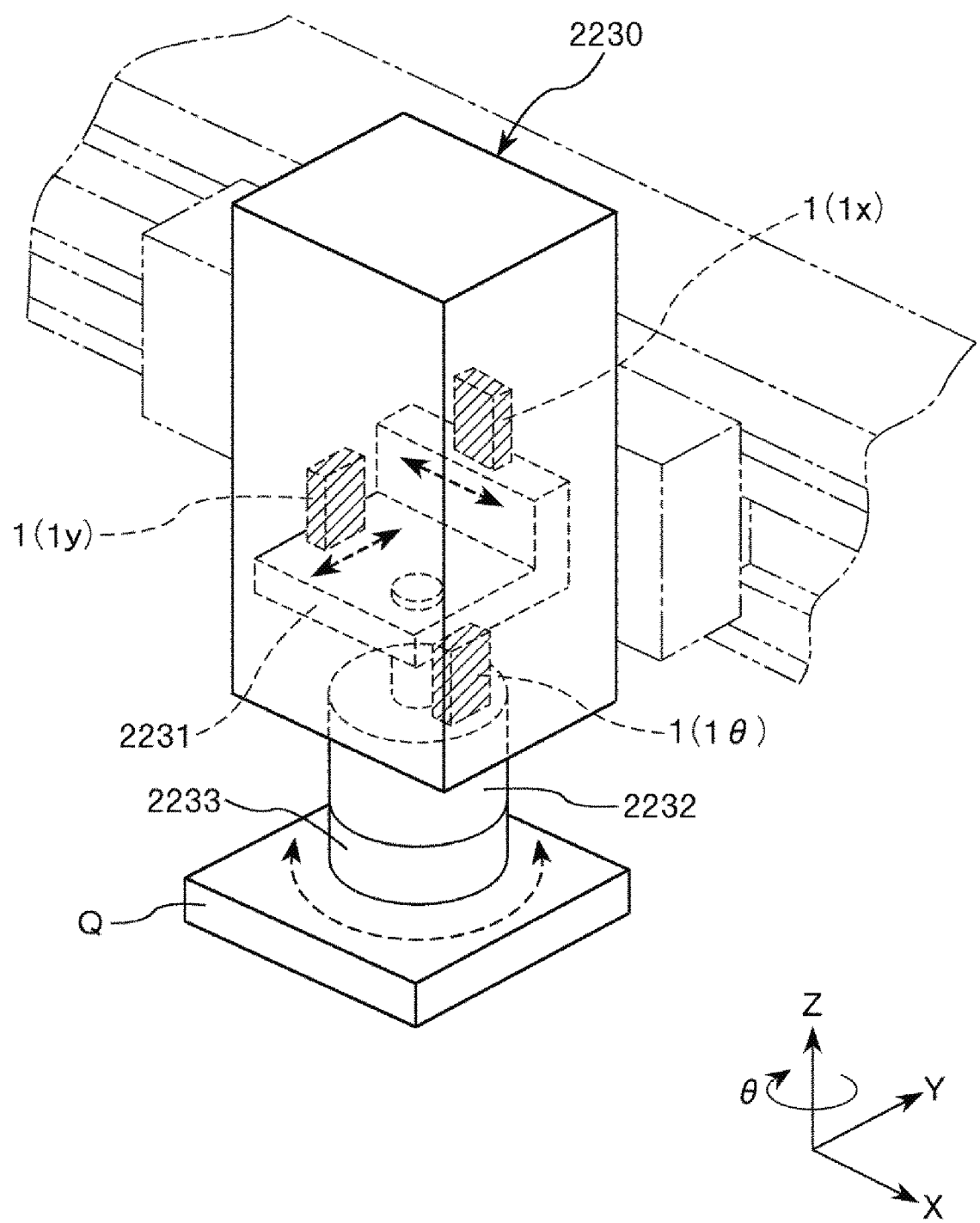
FIG. 22 is a perspective view showing an electronic component holding part of the electronic component conveyance apparatus shown in FIG. 21.

FIG. 21 is a perspective view showing the electronic component conveyance apparatus according to the sixth embodiment of the invention. FIG. 22 is a perspective view of an electronic component holding part of the electronic component conveyance apparatus shown in FIG. 21. Note that, hereinafter, for convenience of explanation, three axes orthogonal to one another are an X-axis, a Y-axis, and a Z-axis.

An electronic component conveyance apparatus 2000 shown in FIG. 21 is applied to an electronic component inspection apparatus, and has a base 2100 and a support 2200 provided on the side of the base 2100. Further, on the base 2100, an upstream stage 2110 on which an electronic component Q to be inspected is mounted and conveyed in the Y-axis direction, a downstream stage 2120 on which an electronic component Q that has been inspected is mounted and conveyed in the Y-axis direction, and an inspection table 2130 located between the upstream stage 2110 and the downstream stage 2120, on which electrical characteristics of an electronic component Q is inspected are provided. Note that examples of the electronic component Q include e.g. a semiconductor, semiconductor wafer, display device such as CLD and OLED, quartz device, various sensors, inkjet head, various MEMS devices, etc.

Further, a Y-stage 2210 movable in the Y-axis directions with respect to the support 2200 is provided on the support 2200, an X-stage 2220 movable in the X-axis directions with respect to the Y-stage 2210 is provided on the Y-stage 2210, and an electronic component holding part 2230 movable in the Z-axis directions with respect to the X-stage 2220 is provided on the X-stage 2220. As shown in FIG. 22, the electronic component holding part 2230 has a fine adjustment plate 2231 movable in the X-axis directions and the Y-axis directions, a rotation part 2232 rotatable about the Z-axis with respect to the fine adjustment plate 2231, and a holding part 2233 provided in the rotation part 2232 and holding the electronic component Q. Further, in the electronic component holding part 2230, a piezoelectric actuator 1 (1x) for moving the fine adjustment plate 2231 in the X-axis directions, a piezoelectric actuator 1 (1y) for moving the fine adjustment plate 2231 in the Y-axis directions, and a piezoelectric actuator 1 (1θ) for rotating the rotation part 2232 about the Z-axis are provided.

The electronic component conveyance apparatus 2000 includes the piezoelectric actuators 1, and thereby, may enjoy the above-described advantages of the piezoelectric actuators 1 and may exert good reliability.

Seventh Embodiment

Next, a printer according to the seventh embodiment of the invention will be explained.

Figure 23:
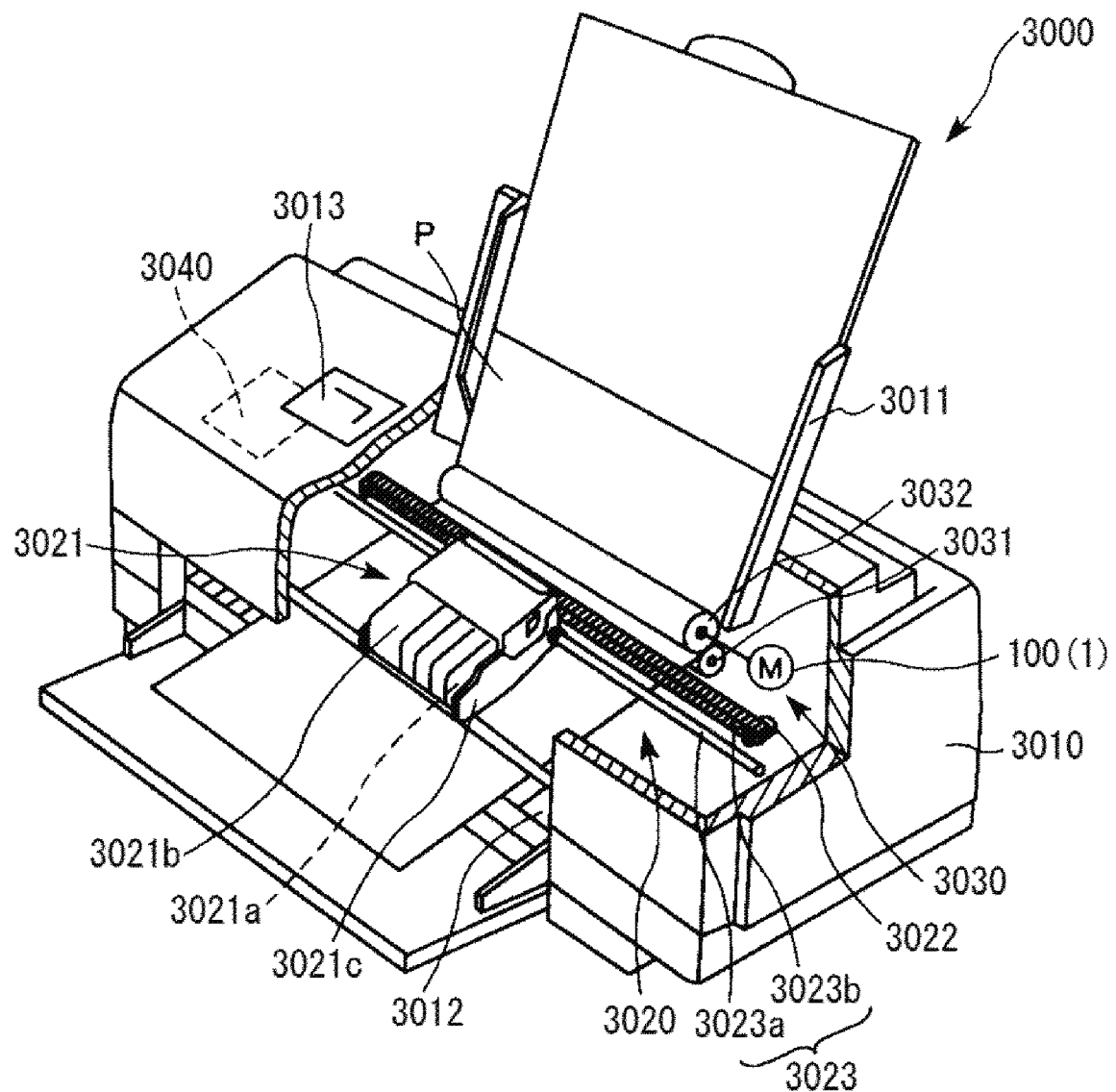
FIG. 23 is a schematic view showing an overall configuration of a printer according to a seventh embodiment of the invention.

FIG. 23 is a schematic view showing an overall configuration of the printer according to the seventh embodiment of the invention.

A printer 3000 shown in FIG. 23 includes an apparatus main body 3010, a printing mechanism 3020 provided inside the apparatus main body 3010, a paper feed mechanism 3030, and a control unit 3040.

In the apparatus main body 3010, a tray 3011 in which recording paper P is placed, a paper eject opening 3012 through which the recording paper P is ejected, and an operation panel 3013 including a liquid crystal display are provided.

The printing mechanism 3020 includes a head unit 3021, a carriage motor 3022, and a reciprocation mechanism 3023 that reciprocates the head unit 3021 by drive power of the carriage motor 3022.

The head unit 3021 has a head 3021a as an inkjet recording head, an ink cartridge 3021b that supplies ink to the head 3021a, and a carriage 3021c on which the head 3021a and the ink cartridge 3021b are mounted.

The reciprocation mechanism 3023 has a carriage guide shaft 3023a that reciprocally supports the carriage 3021c and a timing belt 3023b that moves the carriage 3021c on the carriage guide shaft 3023a by drive power of the carriage motor 3022.

The paper feed mechanism 3030 has a driven roller 3031 and a drive roller 3032 in press contact with each other, and a piezoelectric motor 100 as a paper feed motor that drives the drive roller 3032.

The control unit 3040 controls the printing mechanism 3020, the paper feed mechanism 3030, etc. based on printing data input from a host computer such as a personal computer, for example.

In the printer 3000, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

The printer 3000 includes the piezoelectric motor 100 (piezoelectric actuator 1). Accordingly, the printer may enjoy the above-described advantages of the piezoelectric actuator 1 and may exert good reliability. Note that, in the embodiment, the piezoelectric motor 100 drives the drive roller 3032 for paper feed, however, may additionally drive e.g. the carriage 3021c.

As above, the piezoelectric actuator, piezoelectric motor, robot, electronic component conveyance apparatus, printer, and manufacturing method of the piezoelectric actuator according to the invention are explained based on the illustrated embodiments, however, the invention is not limited to those. The configurations of the respective parts may be replaced by arbitrary configurations having the same functions. Further, other arbitrary configurations may be added to the invention. Furthermore, the respective embodiments may be appropriately combined.

Further, in the above-described embodiments, the configurations in which the piezoelectric actuators are applied to the robot, electronic component conveyance apparatus, and printer are explained, however, the piezoelectric actuators may be applied to other various electronic devices than those, e.g., a projector.

The entire disclosure of Japanese Patent Application No. 2016-185870, filed Sep. 23, 2016 is expressly incorporated by reference herein.

What is claimed is:
1. A piezoelectric actuator comprising:
   a vibrator having a vibrating member including a piezoelectric element and a transmitting member provided in the vibrating member, the transmitting member transmitting drive power to a driven part; and
   an energizing member configured to energize the vibrator toward the driven part,
   wherein the energizing member has a base connected to the vibrator and a pair of springs integrally formed with the base, and wherein the energizing member has a region overlapping with the vibrating member in a plan view as seen from a direction in which the vibrator and the energizing member overlap, and an air gap is provided between the energizing member and the vibrating member in the overlapping region.

2. The piezoelectric actuator according to claim 1, wherein the energizing member contains silicon.

3. The piezoelectric actuator according to claim 1, wherein the energizing member has an etching surface that is formed by etching.

4. The piezoelectric actuator according to claim 1, wherein the vibrator has a support that is connected to the base and supports the vibrating member.

5. The piezoelectric actuator according to claim 1,
wherein the energizing member is configured with a plurality of energizing members, and
wherein the vibrator is provided between the plurality of the energizing members.

6. The piezoelectric actuator according to claim 1, wherein the energizing member has a connector connected to the base via the pair of springs, and
the connector is provided side by side with the base in a direction crossing an energization direction of the vibrator.

7. The piezoelectric actuator according to claim 1, comprising a plurality of the vibrators,
wherein the plurality of the vibrators are stacked.

8. A piezoelectric motor comprising the piezoelectric actuator according to claim 1.

9. A piezoelectric motor comprising the piezoelectric actuator according to claim 2.

10. A piezoelectric motor comprising the piezoelectric actuator according to claim 3.

11. A robot comprising the piezoelectric actuator according to claim 1.

12. A robot comprising the piezoelectric actuator according to claim 2.

13. A robot comprising the piezoelectric actuator according to claim 3.

14. An electronic component conveyance apparatus comprising the piezoelectric actuator according to claim 1.

15. An electronic component conveyance apparatus comprising the piezoelectric actuator according to claim 2.

16. An electronic component conveyance apparatus comprising the piezoelectric actuator according to claim 3.

17. A printer comprising the piezoelectric actuator according to claim 1.

18. A printer comprising the piezoelectric actuator according to claim 2.

19. A piezoelectric actuator comprising:
a vibrator having a vibrating member including a piezoelectric element and a transmitting member provided in the vibrating member, the transmitting member transmitting drive power to a driven part; and
an energizing member configured to energize the vibrator toward the driven part,
wherein the energizing member has a base connected to the vibrator and a pair of springs integrally formed with the base,
wherein the energizing member has a connector connected to the base via the pair of springs, and
the connector is provided side by side with the base in a direction crossing an energization direction of the vibrator.

* * * * *